United States Patent
Ohnuma et al.

[11] Patent Number: 6,072,193
[45] Date of Patent: Jun. 6, 2000

[54] THIN-FILM TRANSISTOR AND SEMICONDUCTOR DEVICE USING THIN-FILM TRANSISTORS

[75] Inventors: Hideto Ohnuma, Kanagawa; Shunpei Yamazaki, Tokyo, both of Japan

[73] Assignee: Semiconductor Energy Laboratory Co., Ltd., Kanagawa-ken, Japan

[21] Appl. No.: 09/079,156

[22] Filed: May 15, 1998

[30]    Foreign Application Priority Data

May 30, 1997 [JP] Japan ................................. 9-157652

[51] Int. Cl.⁷ .................................................. H01L 29/76
[52] U.S. Cl. ............................... 257/57; 257/49; 257/50; 257/51; 257/52; 257/57; 257/64; 257/65; 257/66; 257/347; 257/348; 257/349; 257/350
[58] Field of Search ......................... 257/49–72, 347–355

[56]    References Cited

U.S. PATENT DOCUMENTS

| | | |
|---|---|---|
| 4,231,809 | 11/1980 | Schmidt . |
| 4,746,628 | 5/1988 | Takafugi et al. .......................... 437/160 |
| 5,112,764 | 5/1992 | Mitra et al. . |
| 5,147,826 | 9/1992 | Liu et al. . |
| 5,244,819 | 9/1993 | Yue ................................. 148/DIG. 60 |
| 5,254,480 | 10/1993 | Tran . |

(List continued on next page.)

FOREIGN PATENT DOCUMENTS

| | | |
|---|---|---|
| 62-76772 | 4/1987 | Japan . |
| 2-140915 | 5/1990 | Japan . |
| 3-104210 | 5/1991 | Japan . |
| 4-139728 | 5/1992 | Japan . |
| 6-267978 | 9/1994 | Japan . |
| 6-267979 | 9/1994 | Japan . |
| 6-267980 | 9/1994 | Japan . |
| 6-268212 | 9/1994 | Japan . |
| 6-333951 | 12/1994 | Japan . |
| 7-202209 | 8/1995 | Japan . |

OTHER PUBLICATIONS

C. Hayzeiden et al., "In Situ Transmission Electron Microscopy Studies of Silicide–Mediated Crystallization of Amorphous Silicon" Appl. Phys. Lett., 60, 2 (1992) 225.

J.J.P. Bruines et al., Appl. Phys. Lett., 50,9 (1987) 507, " . . . Pulsed Laser Annealing of Amorphous Silicon".

R.C. Cammarata et al., Appl. Phys. Lett., 51, 14 (1987) 1106 " . . . Ni Implanted Si Films".

Y.N. Erokhin et al., Appl. Phys. Lett., 63, 23 (1993) 3173 "Spatially Confined NiSi, Formation at 400° C . . . ".

T. Hempel et al., "Needle–Like Crystallization of Ni Doped Amorphous Silicon Thin Films", *Solid State Communications*, vol. 85, No. 11 pp. 921–924, Mar. 1993 (Received Afer Mar. 22, 1993).

A.V. Dvurechenskii et al., "Transport Phenomena in Amorphous Silicon Doped by Ion Implantation of 3d Metals", Akademikian Lavrentev Prospekt 13, 630090 Novosibirsk 90, USSR, pp. 635–640 (1986).

Y. Wada et al., J. Electrochem, Soc., 125(9)(1978) 1499, "Grain Growth Mechanism of Heavily Doped Phosphorus Implanted Polysilicon".

(List continued on next page.)

*Primary Examiner*—Fetsum Abraham
*Attorney, Agent, or Firm*—Eric J. Robinson; Nixon Peabody LLP

[57] ABSTRACT

In those thin-film transistors (TFTs) employing as its active layer a silicon film crystallized using a metal element, the objective is to eliminate bad affection of such metal element to the TFT characteristics. To this end, in a TFT having as its active layer a crystalline silicon film that was crystallized using nickel (Ni), those regions corresponding to the source/drain thereof are doped with phosphorus; thereafter, thermal processing is performed. During this process, nickel residing in a channel formation region is "gettered" into previously phosphorus-doped regions. With such an arrangement, it becomes possible to reduce the Ni concentration in certain regions in which lightly-doped impurity regions will be formed later, which in turn enables suppression of affection to TFT characteristics.

49 Claims, 12 Drawing Sheets

U.S. PATENT DOCUMENTS

| | | |
|---|---|---|
| 5,262,654 | 11/1993 | Yamazaki . |
| 5,275,851 | 1/1994 | Fonash et al. ............................ 427/578 |
| 5,306,651 | 4/1994 | Masumo et al. ........................... 437/40 |
| 5,308,998 | 5/1994 | Yamazaki et al. ......................... 257/57 |
| 5,313,076 | 5/1994 | Yamazaki et al. ......................... 257/66 |
| 5,403,772 | 4/1995 | Zhang et al. .............................. 437/101 |
| 5,426,064 | 6/1995 | Zhang et al. . |
| 5,457,058 | 10/1995 | Yonehara ................................ 437/173 |
| 5,481,121 | 1/1996 | Zhang et al. . |
| 5,488,000 | 1/1996 | Zhang et al. . |
| 5,492,843 | 2/1996 | Adachi et al. . |
| 5,501,989 | 3/1996 | Takayama et al. ........................ 437/21 |
| 5,508,533 | 4/1996 | Takemura ................................. 257/65 |
| 5,529,937 | 6/1996 | Zhang et al. . |
| 5,531,182 | 7/1996 | Yonehara ................................ 437/109 |
| 5,534,716 | 7/1996 | Takemura ................................. 257/72 |
| 5,543,352 | 8/1996 | Ohtani et al. . |
| 5,563,426 | 10/1996 | Zhang et al. .............................. 257/66 |
| 5,569,610 | 10/1996 | Zhang et al. . |
| 5,569,936 | 10/1996 | Zhang et al. . |
| 5,576,556 | 11/1996 | Takemura et al. ........................ 257/69 |
| 5,580,792 | 12/1996 | Zhang et al. . |
| 5,585,291 | 12/1996 | Ohtani et al. . |
| 5,589,694 | 12/1996 | Takayama et al. . |
| 5,595,923 | 1/1997 | Zhang et al. ..................... 148/DIG. 16 |
| 5,595,944 | 1/1997 | Zhang et al. . |
| 5,604,360 | 2/1997 | Zhang et al. . |
| 5,605,846 | 2/1997 | Ohtani et al. . |
| 5,606,179 | 2/1997 | Yamazaki et al. . |
| 5,608,232 | 3/1997 | Yamazaki et al. . |
| 5,612,250 | 3/1997 | Ohtani et al. . |
| 5,614,426 | 3/1997 | Funada et al. . |
| 5,614,733 | 3/1997 | Zhang et al. .............................. 257/66 |
| 5,616,506 | 4/1997 | Takemura . |
| 5,619,044 | 4/1997 | Makita et al. ............................. 257/64 |
| 5,620,910 | 4/1997 | Teramoto . |
| 5,621,224 | 4/1997 | Yamazaki et al. . |
| 5,624,851 | 4/1997 | Takayama et al. . |
| 5,637,515 | 6/1997 | Takemura . |
| 5,639,698 | 6/1997 | Yamazaki et al. . |
| 5,643,826 | 7/1997 | Ohtani et al. . |
| 5,646,424 | 7/1997 | Zhang et al. . |
| 5,654,203 | 8/1997 | Ohtani et al. . |
| 5,656,825 | 8/1997 | Kusumoto et al. . |
| 5,663,077 | 9/1997 | Adachi et al. . |
| 5,677,549 | 10/1997 | Takayama et al. . |
| 5,696,003 | 12/1997 | Makita et al. ............................. 437/21 |
| 5,696,386 | 12/1997 | Yamazaki . |
| 5,696,388 | 12/1997 | Funada et al. . |
| 5,700,333 | 12/1997 | Yamazaki et al. . |
| 5,705,829 | 1/1998 | Miyanaga et al. . |
| 5,712,191 | 1/1998 | Nakajima et al. . |
| 5,756,364 | 5/1998 | Tanaka et al. . |

OTHER PUBLICATIONS

Y. Kawazu, H. Kudo, S. Onari, T. Arai, "Low Temperature Crystallization of Hydrogenated Amorphous Silicon Induced by Nickel Silicide Formation"; J.J. Appl. Phys., vol. 29, No. 12, Dec., 1990, pp. 2698–2704.

"Crystallized Si Films By Low–Temperature Rapid Thermal Annealing of Amorphous Silicon", R. Kakkad, J. Smith, W.S. Lau, S.J. Fonash, J. Appl. Phys. 65 (5), Mar. 1, 1989, 1989 American Insitute of Physics, pp. 2069–2072.

"Polycrystalline Silicon Thin Film Transistors on Corning 7059 Glass Substrates using Short Time, Low Temperature Processing", G. Liu, S.J. Fonash, Appl. Phys. Lett. 62 (20), May 17,1993, 1993 American Institute of Physics, pp. 2554–2556.

Selective Area Crystallization of Amorphous Silicon Films by Low–Temperature Rapid Thermal Annealing: Gang Liu and S.J. Fonash, Appl. Phys. Lett. 55 (7), Aug. 14, 1989, 1989 American Institute of Physics, pp. 660–662.

"Low Temperature Selective Crystallization of Amorphous Silicon", R. Kakkad, G. Liu, S.J. Fonash, Journal of Non–Crystalline Solids, vol. 115, pp. 66–68.

M. Bonnel et al. IEEE Electron Dev. Lett. 14(12)(1993)551, "Polysi TFTs with Two–Step Annealing Process".

S. Caune et al., Appl. Surf. Sci., 36(1989)597, "Combined CW Laser and Furnace Annealing of Amorphous Si and Ge in Contact with Some Metals".

M. Fuse et al., Solid State Phenomena, 37–38 (1994) 565, ". . . Polysi TFTs Excimer Laser Annealing . . . with or without Solid Phase Crystallization".

F. Fortuna, et al., Appl. Surf. Sci 73(1993) 264, . . . Ion Beam Induced Si Crystallization from a Silicide Interface.

G. Radnoczi, et al., Thin Solid Films, 240 (1994) 39, "Defects in Amorphous and SPE Si".

O. Schoenfeld, et al., Thin Solid Films 261 (1995) 236, "Crystallization of a–Si by NiSi2 Precipitates".

K.S. Nam et al., Jpn, J. Appl. Phys. 32 (1–5A) (1993) 1908, "TFTS with Polysi . . . by New Annealing Method".

S. W. Lee et al., AM–LCD '95, p. 113 "Low Temperature Polys–Si TFT Fabrication by Nickel–Induced Lateral Crystallization of Amorphous Silicon Films".

S.M. Sze, VLSI Technology, p. 397.

T. Shinohara et al., Electron & Comm. Japan, Part 2, 76(10(1993)99 ". . . TFTs using self aligned grain boundary control . . . " (absract).

F. Oki et al., J.J. Appl. Phys.., 8(1969) 1056, "Effect of Deposited Metals on Crystallization of d–Ge . . . ".

M.H.. Brodsky et al., Bull. AM. Phys. Soc. 16(1971) 304, "Low Temperature . . . Crystallization of Amorphous Materials".

C. Hayzelden et al., J. Appl. Phys., 73,12 (1993) 8279". . . Silicide Mediated Crystallization of Ni Implanted A–Si . . . ".

701　702　703　111

704

705　706　707

708　709　710　711　712

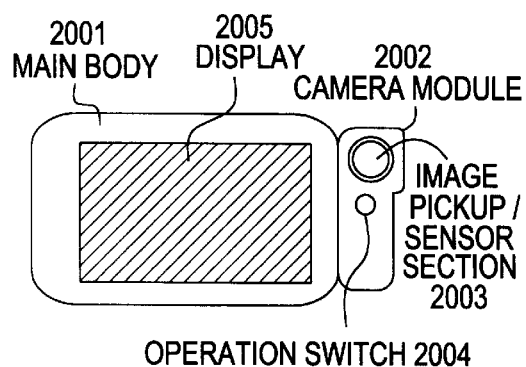
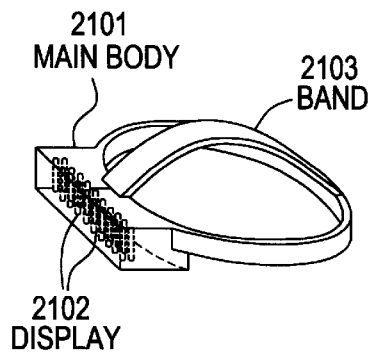
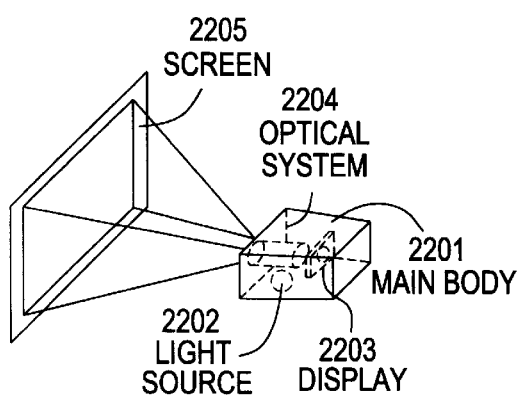
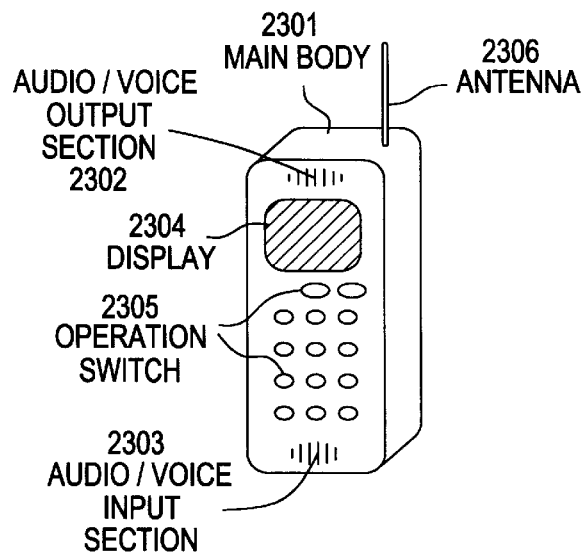
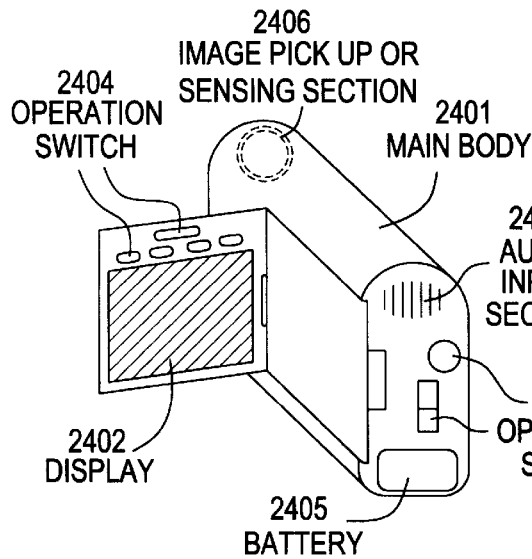
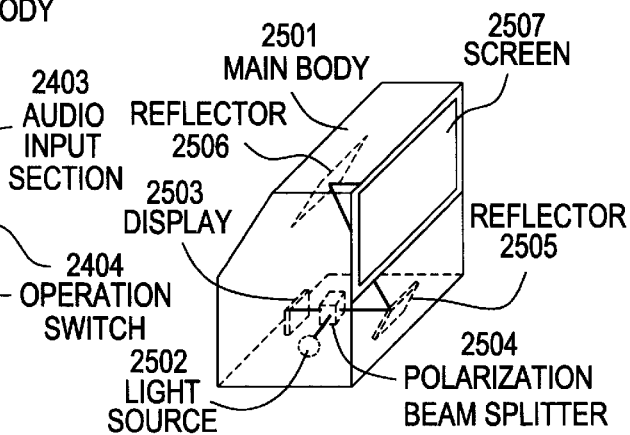

THIN-FILM TRANSISTOR AND SEMICONDUCTOR DEVICE USING THIN-FILM TRANSISTORS

BACKGROUND OF THE INVENTION

1. Field of the Invention

The invention as disclosed in the specification relates to the structure of thin-film transistors (referred to as "TFTs" hereinafter in the specification). The invention also relates to a method for manufacturing the same.

2. Description of the Prior Art

Prior known TFTs are manufactured using a silicon thin-film as formed on a glass substrate or quartz substrate.

Most TFTs that are currently practiced and implemented are those which employ a non-crystalline silicon film (amorphous silicon film) as an active layer thereof.

The amorphous silicon film may be relatively easily fabricated by use of plasma chemical vapor deposition (CVD) techniques.

It has been considered that the technological trend of liquid crystal display (LCD) devices of the active matrix type in near future is to further develop the "system on panel" structure, in which several types of circuits are integrated together on a single glass substrate or quartz substrate, which circuits may include active-matrix circuitry and circuitry for driving the same as well as circuits handling both video image information and a variety of kinds of information items.

To attain such structure required, the currently available TFTs using one or more amorphous silicon films are encountered with a problem: the characteristics thereof remain too low.

Those TFTs using such amorphous silicon films remain low in characteristic, which in turn results in limited applicability—the TFTs are merely applicable to certain active matrix circuits of the active-matrix LCD devices.

More practically, in the TFTs using amorphous silicon films, the mobility is 1 cm$^2$/Vs or less. Yet further, only N-channel type ones are implementable for practical use; P-channel type ones remain too low in characteristic so that these cannot be reduced to practice.

Note here that the mobility of metal oxide semiconductor (MOS) transistors using single-crystalline silicon wafers is typically greater than or equal to 1000 cm$^2$/Vs.

One approach as partly practiced today to overcome this problem is the use of specific TFTs using a crystalline silicon film.

One method for obtaining the crystalline silicon film is to thermally crystallize an amorphous silicon film upon heat application thereto.

For example, plasma CVD techniques or low-pressure CVD techniques are employable to form an amorphous silicon film, which is then heated at temperatures of 800° C. to 1000° C. for several hours thus obtaining a crystalline silicon film with polycrystalline state.

This method has been called the "high-temperature" process due to the fact that high temperatures are utilized which are needed for fabrication of standard integrated circuits (ICs).

A TFT with the resultant crystalline silicon film thus obtained by the aforesaid method is such that an N-channel type one has its mobility of approximately 100 cm$^2$/Vs whereas a P-channel type one has the mobility of 60 cm$^2$/Vs or more or less.

With the characteristics of such degrees, it is possible to form complementary MOS (CMOS) circuits as required to constitute integrated circuits. In addition, it may also be possible to employ such TFTs to configure those circuits that have conventionally been arranged by prior known ICs using single-crystal silicon wafers, although these are not sufficient to fully meet the intended characteristics.

However, in order to fabricate the TFT using the crystalline silicon film, it should be required that a specific substrate with increased thermal resistivity (this is limited to quartz only in the current situation) be employed, which would result in an increase in production cost (due to the cost penalty of such quartz substrate).

An alternative approach as currently studied is to make use of a glass substrate of low cost while adequately rearranging the crystallization method per se.

This approach is called the "low-temperature" process due to the fact that fabrication is done through specific processes which require thermal processing at selected temperatures that give no affection to the heat durability of a glass substrate used.

One typical approach incorporating the above concept is a technique for crystallization of an amorphous silicon film at a heat-up temperature that is carefully controlled permitting the glass substrate to thermally withstand.

By way of example, an amorphous silicon film is formed on a glass substrate; then, the resulting structure is heated up at a temperature of 600° C. for 48 hours to thereby obtain a crystalline silicon film.

Unfortunately, a TFT employing such resultant crystalline silicon film will fail to exhibit any satisfactory characteristics.

Another problem is that production costs are not so lower than expected because of an increase in heat-up time duration.

Still another approach to the low-temperature process is a technique for irradiation of laser light to thereby alter or transform in nature an amorphous silicon film into the intended crystalline silicon film.

This approach is advantageous in that a glass substrate used remains almost free from heat application.

It is possible for those TFTs obtainable by this technique (called the "laser process") to attain superior characteristics which may correspond to the characteristics of TFTs as obtained by high-temperature processes.

It has been found that the TFTs as obtained by the prescribed low-temperature process yet remain too low in characteristic to achieve the system-on-panel architecture required.

The technologies required here may include:

(1) Low-temperature process; and (2) Attainability of even higher characteristics than those of TFTs obtained by laser processes.

As the technique for satisfying the requirement items, the applicants of this patent application has developed one specific scheme of crystallization which introduces a minute amount of metal element of an amorphous silicon film for later effectuation of thermal processing to thereby perform crystallization. This technique has been disclosed in Published Unexamined Japanese Patent Application No. 7-321337.

Those TFTs employing such crystalline silicon films obtained by this method offer considerably high performance. However, some of the crystalline silicon films obtained by this method can contain therein residual metal elements as have been used for crystallization processes, which residual elements can badly affect the characteristics of the TFTs.

Practically, with regard to the items of the reliability and the uniformity of characteristics among device, it has been affirmed that the TFTs remain less as compared to the conventional TFTs of low characteristics.

A Study by the present inventors has revealed the fact that the low reliability of device characteristics and low uniformity of characteristics thereof are originated from affection of such metal elements that continue residing within crystalline silicon films fabricated.

SUMMARY OF THE INVENTION

An object of the invention as will be disclosed in the specification is to provide a technique adaptable for use with TFTs fabricated using a crystalline silicon film as crystallized using a chosen metal element, for suppression of any possible affection or bad influence of residual metal elements on the TFT device characteristics.

One of the inventive concepts as disclosed in this specification has a high-resistivity region disposed in close proximity to a channel region, and a source or drain region disposed adjacent to said high-resistivity region, featured in that said source or drain region contains therein a metal element for acceleration of crystallization of silicon at a high concentration, and that said high-resistivity region contains said metal element at a low concentration.

A structure of another invention has a high-resistivity region disposed neighboring to a channel region, and a source or drain region disposed neighboring to said high-resistivity region, characterized in that said source or drain region contains therein a metal element for acceleration of crystallization of silicon at a concentration greater than or equal to $1 \times 10^{19}$ atoms/cm$^3$, and that said metal element is contained in said channel region and said high-resistivity region at a concentration less than or equal to $1 \times 10^{17}$ atoms/cm$^3$.

No particular problems will arise even when the source or drain region contains the metal element at a concentration greater than or equal to $1 \times 10^{19}$ atoms/cm$^3$. However, in the high-resistivity region (an offset region or lightly-doped impurity region as will be described in the specification), it is a key feature that the concentration of the metal element is less than or equal to $1 \times 10^{17}$ atoms/cm$^3$. This can be said because the presence of such metal element in the high-resistivity region greatly contributes to formation of an unnecessary energy level(s). In addition, it may be permissible that the concentration of metal element in the source and drain regions is greater than the density of defects in said region. In the high-resistivity region, however, it is required that the concentration of the metal element be less than the defect density of the region.

A structure of still another invention is such that the source or drain region is doped with phosphorus therein, and that the phosphorus doped is higher in concentration than the metal element. With such an arrangement, it becomes possible to obtain extra-high nickel-element "gettering" effect in the source or drain region.

A structure of yet another invention is featured in that the source or drain region is of P type conductivity, and that the source and drain regions are doped with phosphorus.

It may be most preferable in viewpoints of reproducibility and effect that nickel (Ni) is used as the metal element for acceleration of crystallization of silicon.

Additionally, the metal element used may be one or several elements as selected from the group consisting of Fe, Co, Ni, Ru, Rh, Pd, Os, Ir, Pt, Cu and Au.

In the structure with high-resistivity regions such as a lightly-doped impurity region and an offset region being disposed in contact with a neighboring channel region, letting the source and drain regions (at least one of them) be the gettering cites causes the nickel density or concentration to decrease in the high-resistivity regions.

In order to let the source/drain regions be such gettering cites, dope phosphorus into these regions while forcing phosphorus to perform what is called the "gettering" of the metal element. This gettering effect becomes significant in particular when nickel is chosen as the metal element.

The presence of a metal element for acceleration of crystallization of silicon which may typically be nickel will be problematic in those regions which follow:

(1) channel region; and (2) interface between the channel region and its neighboring region as well as "nearby" regions thereof.

The presence of the aforesaid metal element in the channel region deteriorates an inherent function of the channel that the surface on the side of a gate insulation film can change in conductivity type due to application of an electric field from a gate electrode to form the so called the inversion layer therein.

This takes place because of the fact that if the metal element exists then an increased number of unnecessary energy levels occur in the forbidden band within the channel region.

Typically, a junction of those regions having the opposite conductivity types is formed at the interface between the channel region and its nearby region adjacent thereto, which junction may be an IN junction or PN junction section.

One example is that in one typical TFT structure, its source/drain regions are disposed in contact with a channel region neighboring thereto. In this structure a PN junction is formed at the interface between the channel region and the source/drain regions while the TFT is turned off during operation.

Another example is that in a structure with a lightly-doped impurity region—typically, a lightly-doped drain (LDD) region—being disposed at a location neighboring to the channel region, a similar PN junction will be formed at the interface between the channel region and the lightly-doped impurity region during a turn-off operation.

A further example is that in a structure with an offset region placed neighboring to the channel region, a PI or NI junction will be formed at the interface between the channel region and the offset region during the turn-off operation also.

Generally, if the metal element is present at such junction portion or portions of the opposite conductivity types, then these portions reduce their expected effect and functions obtainable from inherent semiconductor junctions. This is due to the fact that the presence of such residual metal element badly behaves to form or create multiple energy levels in the forbidden band.

By way of example, one or more unnecessary energy levels are formed in the junction portions of opposite conductivity types due to presence of the metal element, which results in occurrence of undesired movement or propagation of carriers therethrough.

This in turn causes a decrease in breakdown voltage and an increase in leak current. In addition, since the state does not occur stably, problems arise such as a decrease in reliability and also deviation of characteristics among devices manufactured.

When employing the inventive concepts as disclosed in the specification, it is first possible to significantly reduce the concentration of such metal element in the channel region per se. It is also possible to noticeably reduce the concentration of the metal element in more than one high-resistivity region neighboring to the channel region. Our experimentation reveals that the concentration could have been lowered to a level of $1 \times 10^{16}$ atoms/cm$^3$ which is no longer detectable by the secondary ion mass spectrometer (SIMS). Note also that when the concentration of metal element in the high-resistivity region drops down at $1 \times 10^{17}$ atoms/cm$^3$ or less, certain technical advantages may be obtainable.

FIGS. 12A and 12B are for explanation of a relative distribution of Ni concentration at respective locations of the active layer of a TFT as obtained by utilizing the invention. FIG. 12A shows schematically the structure of the TFT whereas FIG. 12B illustrates a relative concentration distribution at respective portions. In FIG. 12A, reference numeral 1201 designates a source, 1202 denotes a drain, 1203 indicates a channel, 1204 shows an HRD. In FIG. 12B the transverse axis represents the position whereas vertical axis indicates the relative concentration of Ni.

Arrows shown in FIG. 12B are for indication of the direction of a change of Ni concentration during gettering processes (i.e. whether the concentration becomes higher or lower). The length of each arrow is to indicate a relative magnitude of the ratio of such concentration change.

The term "HRD" as used herein refers to high-resistivity region or domain, which may correspond to a lightly-doped impurity region in embodiments to be described later.

Utilizing the invention disclosed in the specification as shown in FIG. 12 may allow reduction of the concentration of a metal element in the high-resistivity region including a lightly-doped impurity region and an offset region, thereby greatly reducing the concentration of the metal element at those parts whereat a certain junction of opposite conductivity types will be formed.

And, it becomes possible to avoid the problem of introduction of the cause for a decrease in breakdown voltage and an increase in leak current while at the same time avoiding problems as to a decrease in reliability and a variation or deviation of characteristics among devices manufactured.

These and other objects, features and advantages of the invention will be apparent from the following more particular description of preferred embodiments of the invention, as illustrated in the accompanying drawings.

BRIEF DESCRIPTION OF THE DRAWINGS

FIGS. 11A–11F are diagrams showing some examples of a semiconductor device.

FIG. 12A depicts a sectional view of a TFT structure whereas

DETAILED DESCRIPTION OF PREFERRED EMBODIMENTS (First Embodiment)

In this embodiment an example of fabrication of a thin-film transistor of the N-channel type is shown. Some major steps in the manufacture of this embodiment are shown in FIGS. 1 and 2.

Figure 1A:
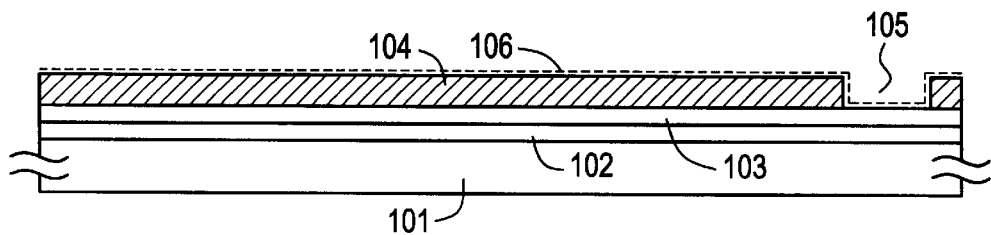
FIGS. 1A through 1E are diagrams showing fabrication processes of a TFT.

First, as shown in FIG. 1A, a glass substrate 101 is prepared; then, a silicon oxide film 102 is formed thereon to a predetermined thickness of 300 nm as an undercoat film. Here, the glass substrate may be a Corning-1737 glass substrate.

Then, an amorphous silicon film 103 is formed to a thickness of 50 nm by low-pressure thermal CVD techniques which employ disilane as a raw material gas.

Next, a mask 104 is formed which is made of a silicon oxide film. This mask 104 is comprised of a silicon oxide film of 120 nm thick with an opening formed therein as designated by reference numeral 105.

This opening 105 has an elongated shape that extends in a direction perpendicular to the paper of the drawing, from its front surface to rear surface side.

After formation of the mask 104, a solution of nickel acetate that is adjusted to have a predetermined nickel density is applied or coated on the top surface of resultant structure thus obtaining the state in which nickel element is maintained in contact with the surface as designated by numeral 106.

In this state the nickel element is kept in contact with the surface of the amorphous silicon film 103 within a region where the opening 105 was formed. In this way, the resulting state is such that the nickel element is selectively contacted with part of the surface of amorphous silicon film 103 as shown in FIG. 1A.

Although the solution was employed here for introduction of the nickel element, the same may alternatively be introduced by ion implantation techniques. In this case, it is possible to more precisely control the amount of introduction of the intended metal element.

Next, the sample or specimen having the structure shown in FIG. 1A is put in a nitride gas atmosphere and then subject to thermal processing at 570° C. for 12 hours.

At this process step the nickel element attempts to diffuse into the amorphous silicon film from the region in which the opening 105 is formed, permitting crystal growth to progress as designated by arrow 107.

This crystal growth progresses in a direction parallel to the film surface. Also, the direction of this crystal growth is identical to a direction perpendicular to the elongate direction of the opening 105. Further, the crystal growth direction remains uniform. (The crystal growth direction will be a radial direction at portions located at the edges of opening 105.)

The crystal growth indicated by numeral 107 may be attained covering an extended distance of 100 μm or longer. This crystal growth will be referred to as the "lateral growth" hereinafter for purposes of convenience of explanation.

At a time point when this crystal growth was completed, a nickel element resides in the film at relatively high density or concentration.

Figure 1B:
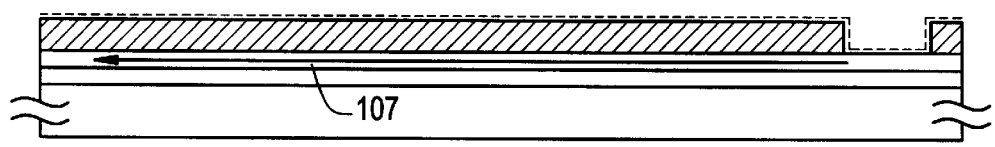
Figure 1C:

After termination of such crystallization the silicon film is then subject to a patterning process thus obtaining a patterned structure as designated by numeral 108 in FIG. 1C. This pattern is for use in arranging active layers of a TFT to be described later.

Here, the pattern 108 of the silicon film is arranged using the region that has been subject to the lateral growth as designated by numeral 107.

Note that the film thickness of the pattern 108 may be less than or equal to 100 nm—preferably, 50 nm or less.

Next, a silicon oxide film 109 which will function as a gate insulation film is formed by plasma CVD techniques to a thickness of 100 nm. In this way the structure shown in FIG. 1C is obtained.

Figure 1D:
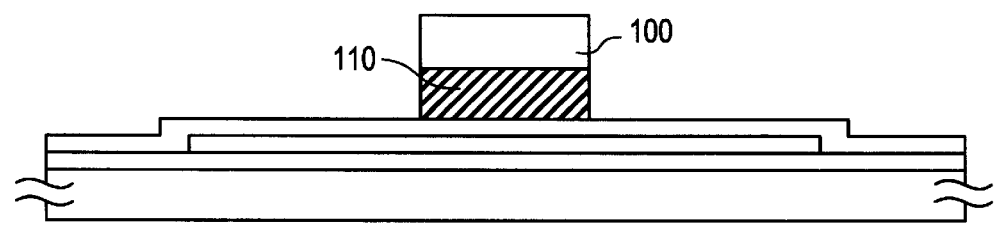

Next, an aluminum pattern 110 is formed. Here, an aluminum film is first formed by sputtering techniques to a thickness of 400 nm. And then, the resultant film is further subject to a patterning process by use of a resist mask 100 so that a pattern designated by 110 is obtained. In thus way a structure shown in FIG. 1D is obtained.

Next, while letting the resist mask 100 reside on the aluminum pattern 110, anodic oxidation or "anodization" is effectuated with the aluminum pattern 110 being as its positive electrode or "anode." At this step an anodic oxide or "anodized" film indicated by numeral 111 is formed to a thickness of 400 nm.

Here, in view of the fact that the anodization processing is to be done with the resist mask 110 residing on aluminum, anodization may selectively progress in a limited direction along the side surfaces of the pattern resulting in formation of anodization films as designated by numeral 111.

In this embodiment the anodization is carried out with a negative electrode or "cathode" made of platinum and using an electrolytic solution as comprised of a water solution which contains therein oxalic acid at 3 volume-%. This anodization film may be obtained as the one which is of a porous structure.

Next, the resist mask 100 is removed away; then, anodization processing is again carried out. Here, an anodization film designated by numeral 112 is formed to a thickness of 70 nm.

Here, an electrolytic solution used may be an ethylene glycol solution containing therein tartaric acid of 3% as neutralized by ammonia water. The resulting anodization film thus formed at this step is the one which has a dense film quality of the barrier type.

At this step the anodization film designated by numeral 112 is formed around the aluminum pattern 113 due to the fact that the electrolytic solution used enters or "invades" the inside of the porous anodization film(s) 111. Thus, a structure shown in FIG. 1E was obtained.

Here, a pattern indicated by numeral 113 becomes a pattern for definition of a gate electrode and its associative gate lead extending therefrom.

Note that part corresponding to the film thickness of anodization film 112 may be used for later formation of an offset region which neighbors the channel region.

In this embodiment, however, since the film thickness of the anodization film 112 is as thin as 70 nm, any offset region will not be formed which functions effectively. Hence, the presence of such offset region will be neglected here.

Additionally, when the film thickness of the anodization film 112 is set at 150 nm or thicker, an offset region is formed whose function is no longer negligible.

After formation of the anodization film 112, a chosen impurity such as phosphorus is then doped by plasma doping techniques. A dose amount of phosphorus is designed so that the regions to be doped become the source and drain regions. It will be preferable that this doping process is performed under the condition or criteria which may cause the concentration of final residual phosphorus is greater than the concentration of nickel after execution of the "gettering" process. With such a setting, it becomes possible to effectuate more effectively the intended gettering of nickel element at later process steps.

Figure 2A:
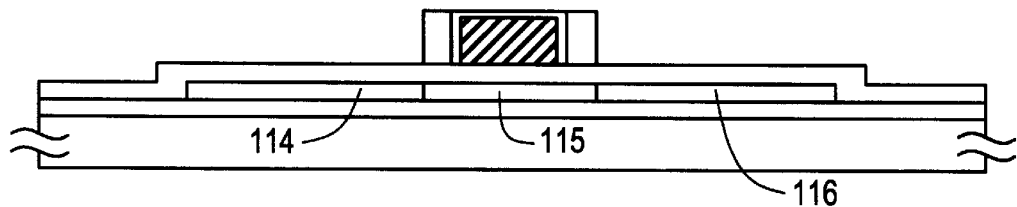
FIGS. 2A to 2D are diagrams showing fabrication processes of a TFT.

At this step a phosphorus impurity is doped into selected regions designated by numerals 114 and 116 in FIG. 2A in a self-alignment manner. No doping is done with respect to a region indicated by numeral 115.

It should be noted that the doping process may be done using ion implantation techniques. In any case, it is preferable that this doping process ionizes impurity element or elements, which are then doped or implanted electrically acceleratively.

It should also be noted that the exposed silicon oxide film 109 may be removed away prior to execution of the doping. In this case a silicon oxide film which has been formed on the surface of 114 and 116 of FIG. 2A are to be removed away.

After completion of the doping shown in FIG. 2A, the porus anodization films 111 are removed. And, doping of phosphorus is again performed by plasma doping techniques.

At this step the doping is done at a carefully selected dose which is lower than the dose amount at the step of FIG. 2A.

At this step certain regions of 117 and 119 are formed as lightly-doped impurity regions. The term "lightly-doped impurity regions" as used herein means that the resulting concentration of any residual phosphorus contained therein is less as compared to the regions of 114 and 116.

Figure 2B:
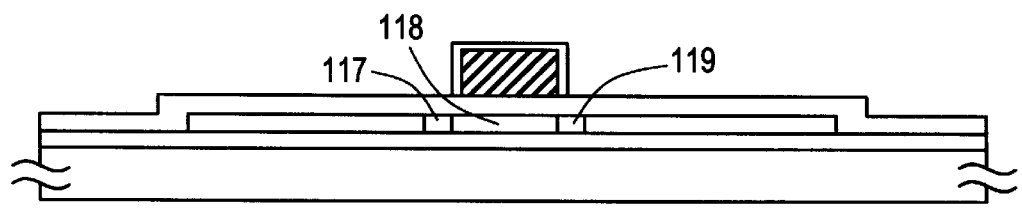

In addition, execution of this step permits a region indicated by numeral 118 which remains free from the doping process to become a channel region. Thus, a structure shown in FIG. 2B is obtained.

Next, the structure is put in the nitride gas atmosphere for effectuation of thermal processing at 450° C. for 2 hours. At this step the nickel element is "gettered" to phosphorus during outdiffusion thereof. This results in a decrease in nickel concentration from the regions of 114 and 116 through the regions of 117 and 119 to the region of 118.

Here, the regions of 117 and 119 are also doped with phosphorus at a relatively low dose; our experimentation tells that the gettering of nickel is mainly carried out within the regions of 114, 116.

Phosphorus and nickel are in a variety of forms of chemical compounds such as $NiP$, $NiP_2$, $Ni_2P$ . . . . The coupling state thereof is extremely stable, and such may exist in a stable state at a heatup temperature of 450° C. or therearound.

More specifically, once nickel and phosphorus are chemically combined together, the resulting combination is hardly disassembled or dissociated again from such state. (At least, not the temperature as used in the fabrication processes of this embodiment.)

Note also that phosphorus captured in silicon will no longer outdiffuse unless the ambient temperature exceeds 800° C.

Accordingly, the result is such that nickel element is highly concentrated to the regions of 114, 116 in which phosphorus is present at an increased density.

Figure 2C:
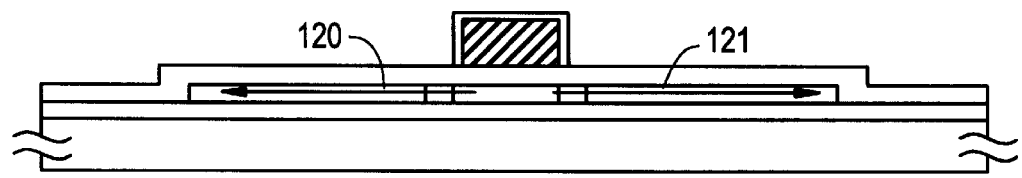

In the way described above, the resulting structure obtained is such that the nickel element was moved or shifted to the regions of 114, 116 as indicated by arrows 120, 121 in FIG. 2C.

It is to be noted that while certain movement of nickel element toward the regions of 117, 119 which are the lightly-doped impurity regions is also present, it is more clearly observable that the nickel element is moved into the regions of 114, 116 as doped with phosphorus at an increased concentration.

Figure 3A:
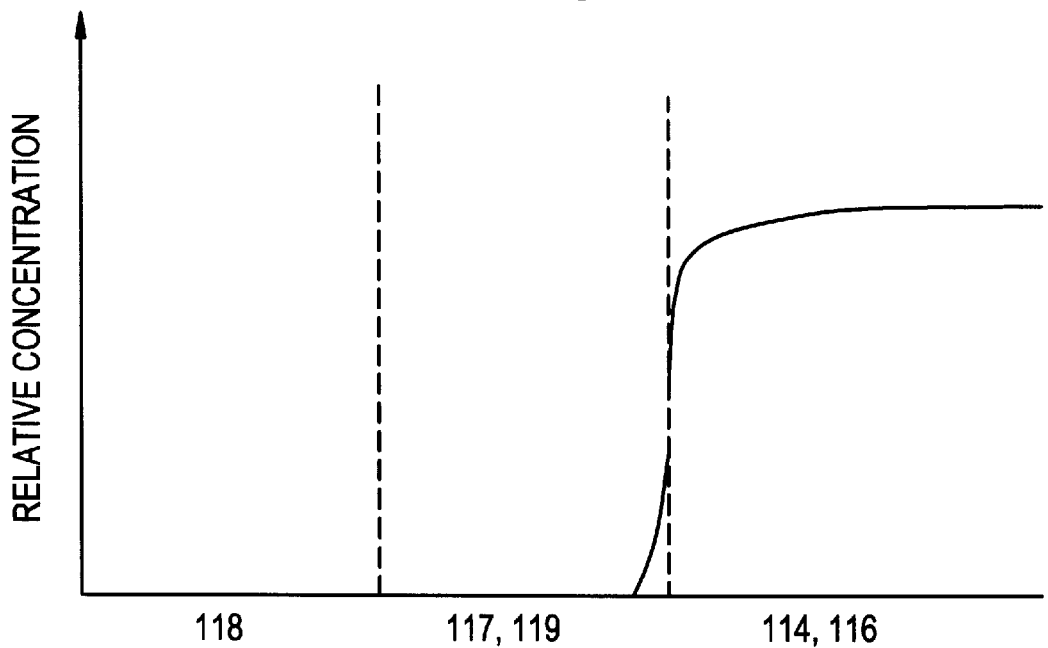
FIG. 3 is a diagram showing a distribution of concentration of nickel and that of phosphorus in an active layer of TFT.
Figure 3B:
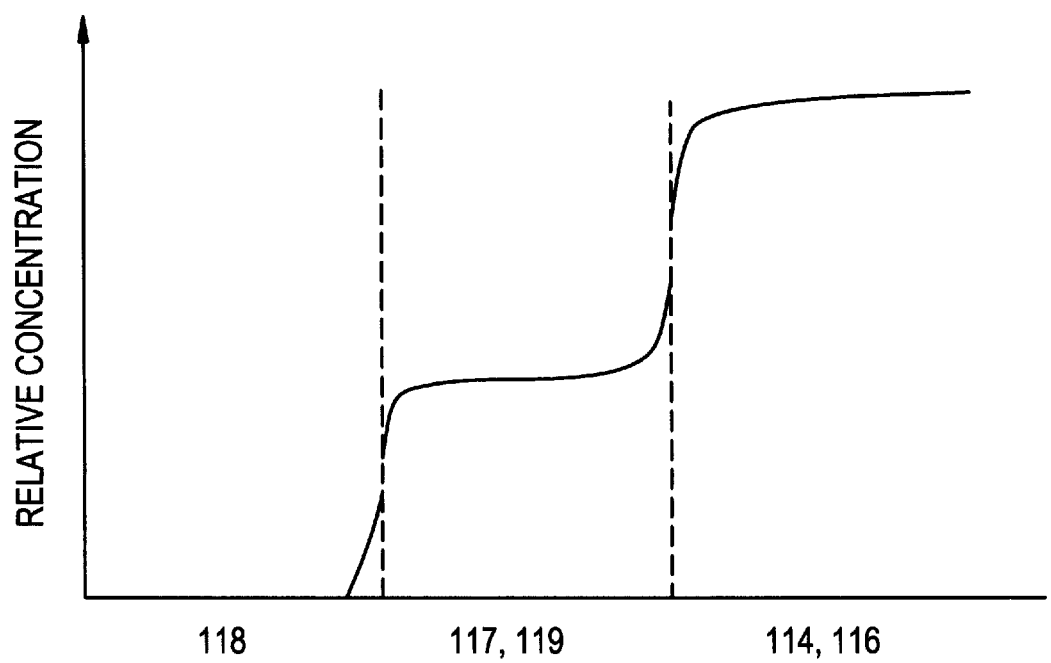

See FIG. 3, which shows a distribution state of nickel element "A" and phosphorus element "B" after completion of the thermal processing. Note that at this thermal process step, a regional improvement of crystallinity of the regions 114, 116, 117 and 119 progresses whose crystallization has been destroyed due to accelerated implantation of impurity ions.

This closely relates to the local concentration of nickel element in such regions (in particular, the regions of 114, 116).

Specifically, the region or regions to which nickel element is concentrated are such that the crystallization due to the action of nickel element is likewise promoted more strongly to thereby cure any possible damages of crystal structures which have occurred during doping of phosphorus ions thereinto.

Especially, with the arrangement shown in this embodiment, the phosphorus ions behave to concentrate at higher density to those regions as heavily doped with phosphorus (that is, the regions with crystallinity destroyed) so that an improvement in crystallinity may progress more effectively at this step.

Then, radiation of laser light is performed for activation of phosphorus doped. Annealing for curing any damages of crystallinity as occurred during the doping may be carried out by thermal processing stated supra.

However, the temperature is as low as 450° C. so that any dopant (phosphorus) remains less in activation ratio. In view of this, this embodiment is so designed as to perform the intended activation of dopant by radiation of laser light in addition to the thermal processing.

Performing this step makes it possible for the regions of 114 and 116 to function as the source and drain regions required.

Figure 2D:
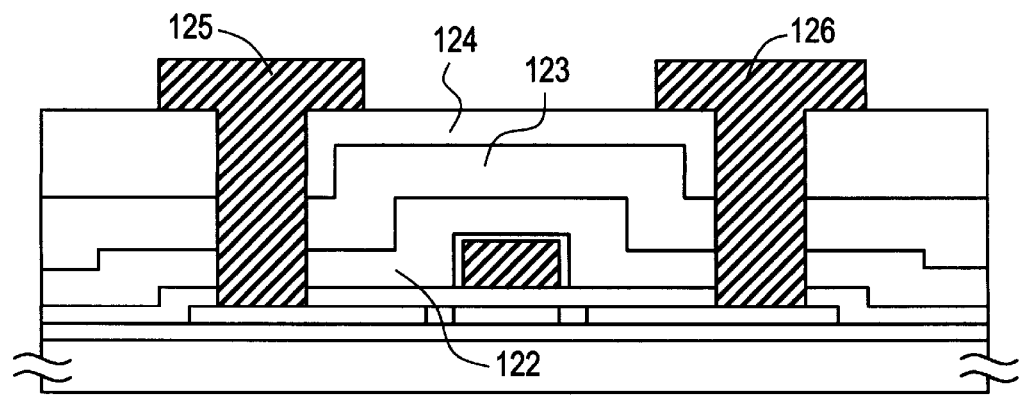

After completion of the laser light radiation, a silicon nitride film 122 is formed by plasma CVD techniques to a thickness of 200 nm as shown in FIG. 2D.

Further, a silicon oxide film 123 is fabricated by plasma CVD techniques to a thickness of 400 nm.

An acrylic resin film 124 is further formed. The film thickness of the acrylic resin film is determined such that the thickness is 700 nm at its minimal part.

As other alternative materials other than acryl, several materials may be employable including but not limited to polyimide, polyamide, polyimide-amide and epoxy. And, contact holes are defined thus forming a source electrode 125 and a drain electrode 126.

In the case of employing the arrangement shown in this embodiment, resultant TFT of N-channel type is such that phosphorus and nickel are contained in the source and drain regions at increased density or concentration. And, phosphorus is contained in the lightly-doped impurity regions 117 and 119 at a lower concentration.

Note that nickel is hardly contained in the channel region 118 and lightly-doped impurity regions 117, 119.

One typical state concerning this concentration distribution is shown in FIG. 3. In this way a TFT may be obtained which has a "special" concentration distribution with regard to nickel and phosphorus.

The TFT shown in this embodiment is as low as 600° C. or less in process temperature required while letting a glass substrate be capable of withstanding; yet further, it comes with active layers having high crystallinity due to the use of nickel element, which may in turn lead to the capability of achievement of high characteristics accordingly.

The characteristics of the TFT as obtained in this embodiment is better than that of high-temperature polycrystalline polysilicon TFTs.

Another advantage is that the high characteristics may be obtainable with enhanced stability and reliability because of the fact that any residual nickel element is fixed or "pinned" to the source/drain regions only, which have substantially no affection to the operation thereof. A further advantage lies in the capability of attainment of a decrease in deviation of characteristics even when multiple TFTs are fabricated simultaneously.

(Second Embodiment)

This embodiment is an example of the case where the fabrication processes shown in the first embodiment are further improved. Some major process steps in the manufacture of this embodiment are shown in FIGS. 4 and 5.

It is to be noted that parts or components with like reference characters adhered thereto are the same as those shown in FIG. 1 in fabrication architecture and in function.

Figure 4A:
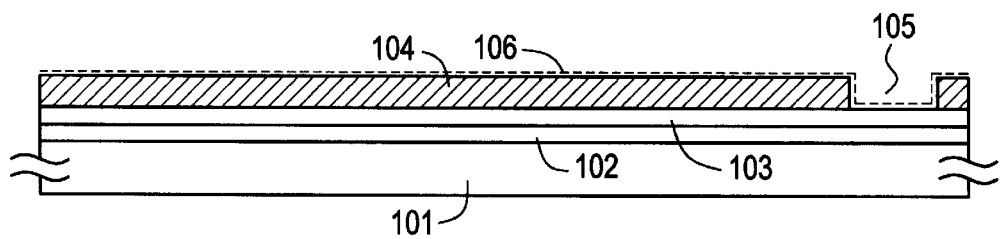
FIGS. 4A–4E are diagrams showing fabrication processes of a TFT.

First of all, as shown in FIG. 4A, a silicon oxide film 102 is formed on a glass substrate 101; further, an amorphous silicon film 103 is formed thereon.

Then, a mask 104 is formed which may be made of a silicon oxide film; then, a nickel acetate solution is coated thus obtaining the state in which nickel element is maintained in contact with the surface as indicated by numeral 106.

Next, thermal processing is performed permitting lateral growth as indicated by numeral 107. (FIG. 4B)

Figure 4B:
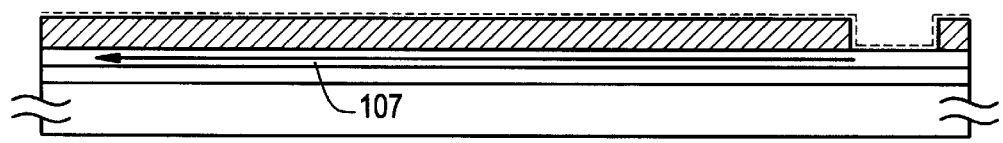
Figure 4C:
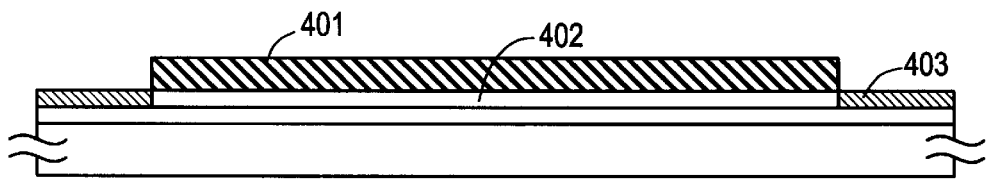

After completion of the lateral growth shown in FIG. 4B, the mask 104 made of the silicon oxide film is removed causing a mask 401 made of a silicon oxide film to be again disposed.

And, phosphorus ions are doped by plasma doping techniques using the mask 401.

At this step doping of phosphorus is carried out in the region of 403. Next, thermal processing is performed. This thermal processing is done at 600° C. for 2 hours in the nitride gas atmosphere.

In this case the nickel element is subject to "gettering" into the region of 403. And, in a region of 402 as doped with no phosphorus, the nickel element decreases significantly in density or concentration.

Figure 4D:
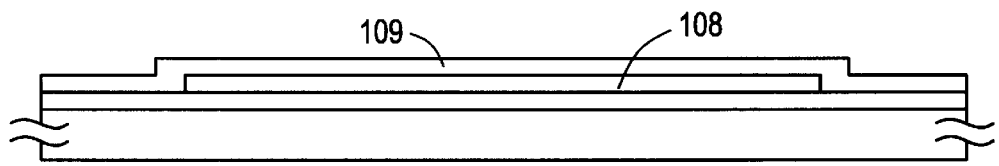

After termination of the gettering process the mask 401 made of the silicon oxide film is then removed away; further, a resist mask is disposed for execution of patterning to thereby obtain a pattern as indicated by numeral 108 in FIG. 4D. This pattern is a pattern which will later define the active layers of a TFT.

This pattern 108 is formed as a pattern which will become further smaller in dimension than the region of 402 that is covered by the mask 401.

This is for intentional or "active" removal of any possible nickel's affection by formation of the active layer pattern 108 of TFT by use of the inside of the region (the region of 402) to which the gettering has been effectuated.

After formation of the active layer pattern 108 a silicon oxide film 109 acting as the gate insulation film is then formed by plasma CVD techniques. Thus, a structure shown in FIG. 4D is obtained.

Figure 4E:
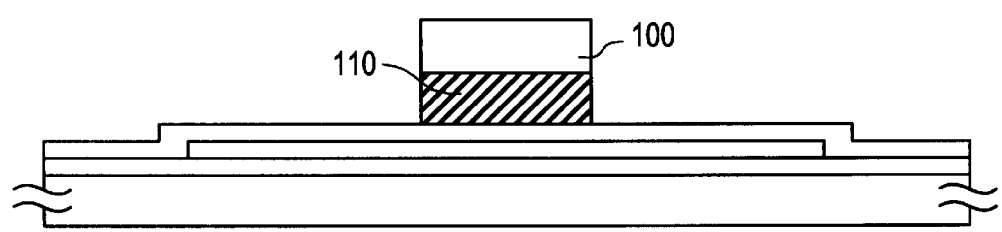

Next, an aluminum pattern 110 shown in FIG. 4E is formed using the resist mask 100.

Figure 5A:
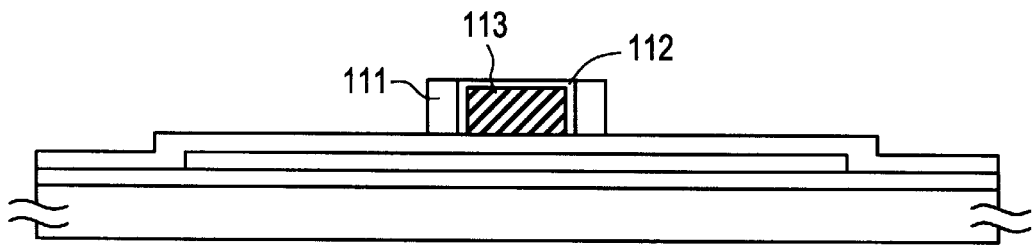
FIGS. 5A–5D are diagrams showing fabrication processes of a TFT.
Figure 5B:
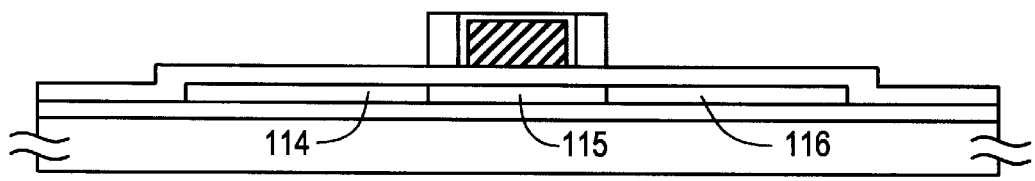

Next, as shown in FIG. 5A, a porus anodization film 111 is formed along with an anodization film 112 of dense film quality.

Next, in this state, phosphorus is doped by plasma doping techniques. Plasma doping techniques may alternatively be employable other than such plasma doping techniques.

This doping process is to be done for achievement of higher impurity concentration than a doping process to be performed at a later stage; in this respect, the former doping will be referred to as the "heavy doping" for purposes of convenience of explanation.

At this doping, heavy doping is performed with respect to the regions of 114 and 116. No such doping is done for the region of 115.

Next, the porus anodization film 111 is removed. And, doping of phosphorus is again carried out. This doping is done at a low dose amount as compared to the prior doping.

Figure 5C:
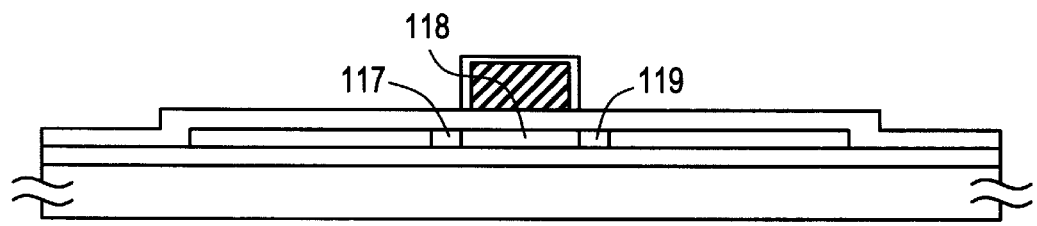

Performing this step results in fabrication of lightly-doped impurity regions 117, 119. Also, a channel region 118 is formed. (FIG. 5C)

In this embodiment these regions are formed in a self-alignment fashion.

Figure 5D:
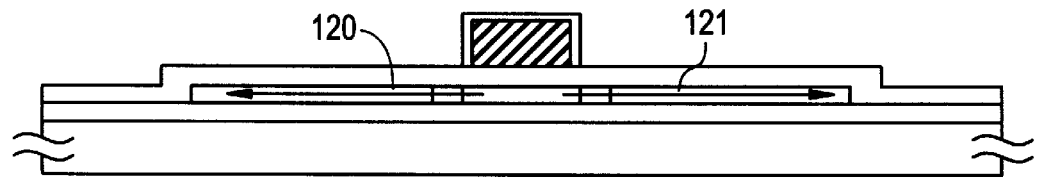

Next, thermal processing is done causing any residual nickel element within the active layer pattern to concentrate to the regions of 114 and 116. In other words, the nickel element residing within the active layer pattern is forced to undergo gettering into the regions of 114 and 116. (FIG. 5D)

In this way it becomes possible to exhaustively remove the presence of nickel components in the channel region and also in certain nearby regions of the interface between the channel region and lightly-doped impurity regions.

Also at this stage of fabrication, annealing of damages in the crystal structure as occurred due to doping processes is carried out simultaneously.

Next, laser light radiation is done activating dopants.

Figure 6A:
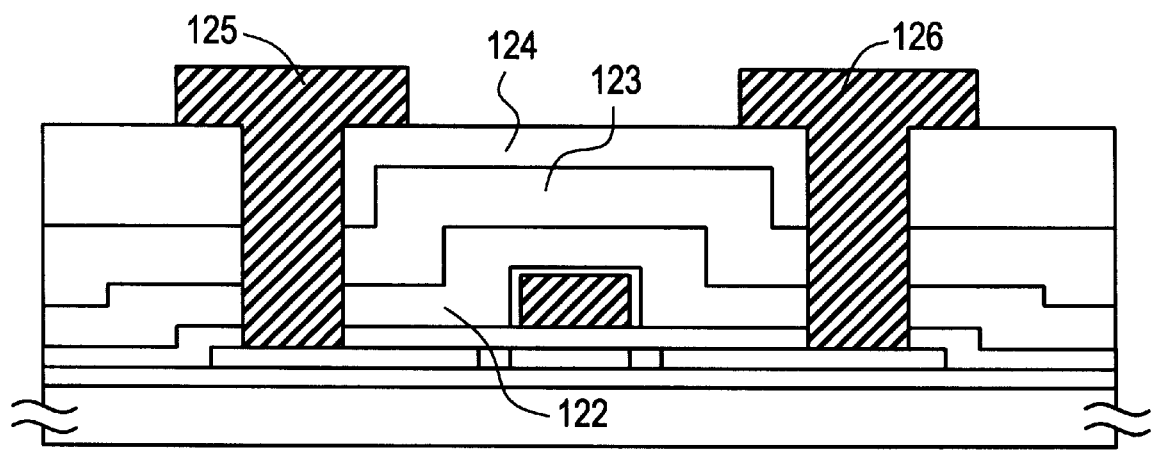
FIG. 6A is a diagram showing a fabrication process of the TFT.

Next, as shown in FIG. 6A, a silicon nitride film 122 and a silicon oxide film 123 are formed by plasma CVD techniques. An acrylic resin film 124 is then formed.

Next, contact holes are defined forming a source electrode 125 and drain electrode 126. It is thus possible to obtain the intended TFT of N-channel type which almost completely removes any residual nickel element away from the channel region as well as those regions which have junctions of the opposite conductivity types.

(Third Embodiment)

In this embodiment an example is shown of the case where offset regions are disposed in the alternative of the lightly-doped impurity regions 117, 119 (see FIG. 2) in the structure shown in the first embodiment.

This embodiment is designed so that the low-dose phosphorus ion implantation is not performed at the step shown in FIG. 2B. In other words, the doping process in FIG. 2B is not executed.

In such case, doping of phosphorus is not carried out with respect to the regions of 117 and 119. Accordingly, the conductivity type of these parts are principally the same as that of the channel region 118.

However, these regions of 117 and 119 are different from the channel in that any inversion layer is hardly formed upon application of an electric field from the gate electrode. (The electric field from the gate electrode has certain spacial expansion so that the above cannot simply be said in a strict sense. However, our discussions continue under such assumption for clarity purposes.)

The regions of 117 and 119 function as high-resistivity regions during operation of the resultant TFT in a way similar to that of the lightly-doped impurity regions. More specifically, these have a function of improving the breakdown voltage and leak characteristics while weakening or reducing the intensity of an electric field as created between the channel region and the drain region.

In the case of this embodiment the regions of 117 and 119 become the offset regions.

In the case of the TFT shown in this embodiment also, it is possible to successfully lower the concentration of the subject metal element in the channel region and in the interface between the channel region and its neighboring regions as well as in a nearby region of the interface.

And, advantages may be obtained such as:

improvement of breakdown voltage and leak current characteristics, increase of reliability, and reduction of deviation in characteristic among respective devices manufactured.

(Fourth Embodiment)

Figure 1E:
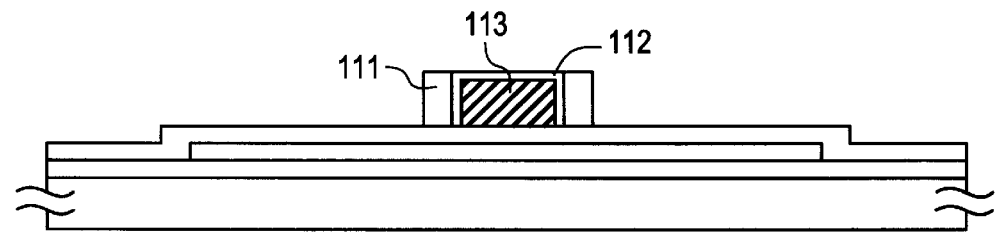

This embodiment relates to a technique for formation of one or more offset regions in the structure of the first embodiment by increasing the thickness of the dense film-quality anodization film 112 of FIG. 1E up to 200 nm and by using the thickness thereof.

In the case of this embodiment the offset regions are to be formed between the channel region 118 and lightly-doped impurity region 117 and also between the channel region 118 and lightly-doped impurity region 119 shown in FIG. 2B.

In the case of this embodiment also, the manufacturing process thereof passes through the step shown in FIG. 2C, which in turn makes it possible to reduce the nickel concentration in the channel region while at the same time lowering the nickel concentration at the interface between the channel region and offset regions.

(Fifth Embodiment)

This embodiment is an example of the case where in the arrangement of the first embodiment and other embodiments, the channel region is doped with a chosen impurity which may act to add thereto the conductivity type.

Generally, in the case of thin-film transistors, the channel region as used therein is made of an intrinsic or substantially intrinsic semiconductor with no technical doping effectuated.

However, there has also been well known a technique for precisely controlling the conductivity type of such channel region in order to control the characteristics—typically, for threshold value control. This technique is called the "channel dope" technology among those skilled in the art.

The channel dope methods may include two main schemes which follow:

(1) Use of ion implantation techniques or plasma doping techniques.

(2) Previously doping a chosen dopant into the starting film that constitutes the active layer.

In this embodiment the scheme (2) is employed. Here, an example is shown which is for doping boron into the channel under the assumption that an N-channel type TFT is to be fabricated.

In this embodiment, formation of the amorphous silicon film 103 at the step shown in FIG. 1A is carried out by low-pressure thermal CVD techniques which employ disilane and diborane as raw material gasses.

When this is done, it is possible by changing the implantation amount of diborane to vary the doping amount of channel dope accordingly.

Although one specific example was shown here relative to the case of fabrication of the N-channel type TFT, the doping gas may be replaced with phosphine if a P-channel type TFT is to be manufactured.

(Sixth Embodiment)

In this embodiment an example is shown of the case where a P-channel type TFT is fabricated by use of the invention as disclosed in the specification.

It is impossible to employ boron to effectuate the "gettering" of nickel. At least, it is not expectable to attain a noticeable gettering effect as in the case of using phosphorus.

Accordingly, where the P-channel type TFT is manufactured using the invention as disclosed in the specification, it is required that the doping of phosphorus for utilization to nickel's gettering be performed independently of the doping of a dopant (boron, in this case) for formation of the source and drain regions.

A manufacturing method of this embodiment is shown using FIGS. 1 and 2. First of all, the structure shown in FIG. 1E is obtained through execution of the manufacturing processes indicated in the first embodiment.

In this stage of fabrication, doping of phosphorus is done by plasma doping techniques (or ion implantation techniques). In this state the resultant structure is under the condition that the regions designated by numerals 701 and 703 of FIG. 7A have been doped with phosphorus. A region of 702 is not doped with any phosphorus.

Here, the phosphorus doping into the regions of 701 and 703 is for removal of the nickel element residing in the regions of 702 with each such region being as a gettering cite.

Figure 7A:
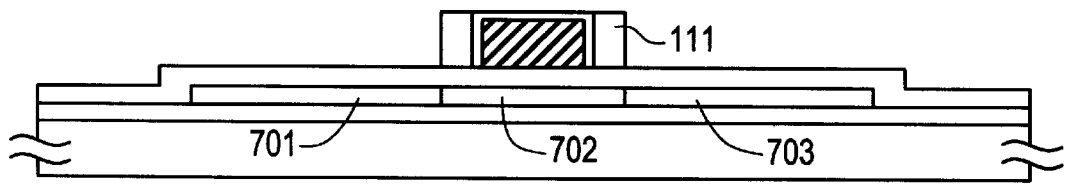
FIGS. 7A–7D are diagrams showing fabrication processes of a TFT.
Figure 7B:
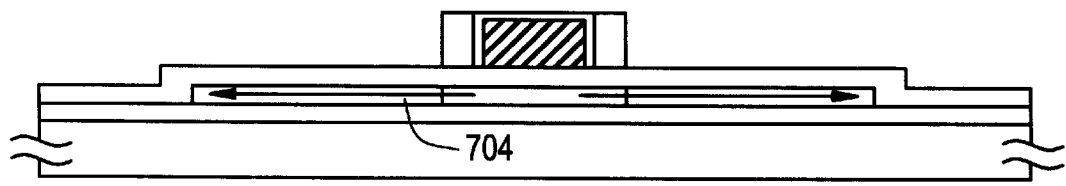

After completion of the doping process shown in FIG. 7A, thermal processing is performed at 450° C. for 2 hours in the nitride gas atmosphere. At this step any residual nickel element attempts to move from the region of 702 toward the regions of 701 and 703 as indicated by arrows 704.

More specifically, the nickel element of the region 702 is forced to undergo the process of "gettering" toward the regions 701 and the region of 703.

Setting of heatup temperature at 450° C. here is originated from the use of aluminum for the gate electrode. In cases where the gate electrode is made of silicon materials and silicide materials as well as metal materials, it will be preferable that the temperature be set at a higher level in view of the heat durability thereof and further by taking account of the thermal durability of substrate.

Figure 7C:
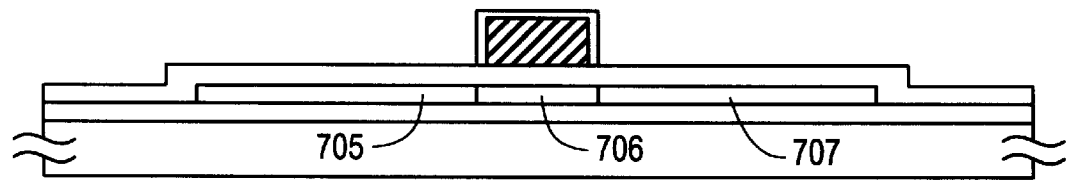

Next, as shown in FIG. 7C, boron is doped by plasma doping techniques. The doping method may alternatively be those methods using ion implantation techniques.

The doping process at this step is to let the regions of 705 and 707 become the source and drain regions. Accordingly, specific criteria should be required for doping boron at a concentration higher than that of phosphorus as has been doped at the step shown in FIG. 7A while causing the N-type converted regions of 701 and 703 to invert to the P type. The region of 706 remains free from any doping process.

After termination of the doping process shown in FIG. 7C, the porus anodization film 111 is then removed away.

And, as shown in FIG. 7D, boron is again doped thereinto. This process is for formation of more than one lightly-doped impurity region; therefore, the doping is done under the condition which permits such regions to be weaker in conductivity type than the regions of 705 and 707 that have experienced the doping at the step of FIG. 7C.

The regions of 708 and 710 do not experience any doping of phosphorus at the step of FIG. 7A so that it may not be required to employ the specific condition which causes them to invert in conductivity type unlike the regions of 711 and 712.

After completion of such doping, laser light radiation is performed for recovery of damages occurred in the to-be-doped regions during doping and also for activation of dopants. This process may be done upon application of heat thereto.

In this way a source region 711 and drain region 712 as well as channel region 709 plus lightly-doped impurity regions 708 and 710 are formed.

Note here that the resulting structure is in the state that nickel element has been "gettered" into the source region 711 and drain region 712.

In this arrangement also, residual nickel element is reduced in amount at locations near the junctions that are present at the interface between a channel and certain regions adjacent to the channel region.

And, this may advantageously serve to permit P-channel type TFTs to offer several effects of improvement in breakdown voltage, reduction of an OFF current, enhancement of reliability, and decrease in deviation of characteristics among devices manufactured.

One significant feature of the TFT shown in this embodiment is that the source and drain regions are doped with both phosphorus and boron while letting boron be higher than phosphorus in concentration.

Another important feature is that the source and drain regions are greater in nickel density or concentration than the channel region and lightly-doped impurity regions.

(Seventh Embodiment)

In this embodiment a structure is shown which is originated from an improvement in the structure shown in the sixth embodiment. With the structure shown in the sixth embodiment, one specific example was indicated of the case where the lightly-doped impurity regions are disposed neighboring to the channel region. (The presence of the offset regions formed using certain part corresponding to the film thickness of the anodization film will be ignored herein.)

Here, an example is shown of the case where the regions that have been such lightly-doped impurity regions are changed to offset regions.

Figure 7D:
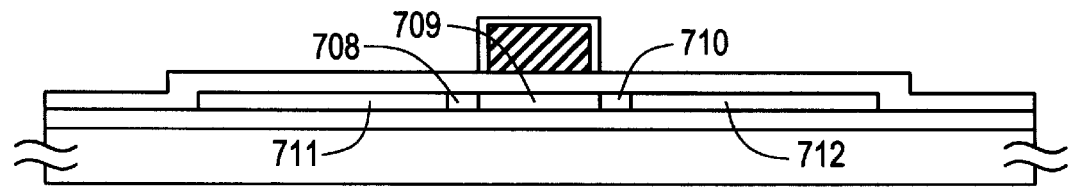

In this embodiment no light-doping of boron is done at the stage shown in FIG. 7D. With such an arrangement, boron doping is not performed with respect to the regions of 708 and 710 so that these regions become the intended offset regions.

Additionally, the offset regions may alternatively be formed adjacent or neighboring to the channel region by increasing the film thickness of a dense anodization film as formed around the gate electrode without having to employ the arrangement shown in this embodiment.

(Eighth Embodiment)

This embodiment is an example of the case where the gate electrode is made of tantalum (Ta) rather than aluminum in another embodiment.

The anodization technology may also be employed when using tantalum. And, formation of lightly-doped impurity regions using anodization films and of offset regions may be performed in a way similar to that in the case of using aluminum.

In addition, tantalum is greater than aluminum in thermal durability; hence, it is possible to carry out the thermal processing at the step shown in FIG. 2C at a heatup temperature of 600° C. for 2 hours, by way of example.

The melting point of tantalum is 2000° C. or higher so that no particular considerations may be paid to the setting of heatup temperatures of thermal processing.

(Ninth Embodiment)

This embodiment is an example of the case where in another embodiment the gate electrode is made of not aluminum but silicon with a selected conductivity type added thereto.

Here, a silicon film with either phosphorus or boron having been doped thereinto is used to constitute the gate electrode. When making use of such silicon material for the gate electrode, it is also possible to employ the criteria permitting execution of the thermal processing at the step shown in FIG. 2C at a heatup temperature of 600° C. for 2 hours.

Alternatively, the gate electrode may be made of a variety of kinds of silicide materials and metallic materials.

When the gate electrode is made of silicon-based materials or silicide materials, it is required that the anodization technique be replaced with other adequate ones for fabrication of the lightly-doped impurity regions.

See FIG. 8, which depicts some major steps in the manufacture of one exemplary TFT with its gate electrode made of a silicon-based material.

Figure 8A:
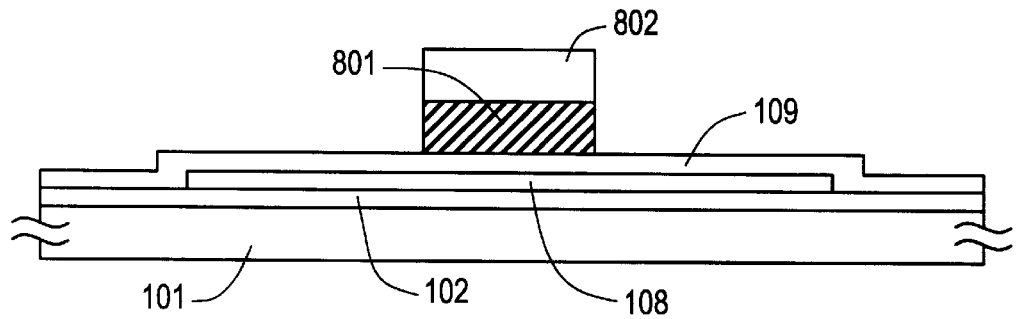
FIGS. 8A–8D are diagrams showing fabrication processes of a TFT.

First, as shown in FIG. 8A, a silicon oxide film 102 is formed as an undercoat film on a glass substrate 101; further, an active layer 108 comprised of a crystalline silicon film is formed in accordance with the process steps of the first embodiment stated supra in conjunction with FIGS. 1A to 1C.

In the resulting structure the active layer 108 contains therein nickel element at a relatively high concentration. The distribution condition of such nickel element is not particularly variable and remains uniform as a whole.

At the stage of formation of a gate insulation film 109, a silicon film is formed by low-pressure thermal CVD techniques with phosphorus being heavily doped thereinto, which film is then patterned using a resist mask 802. A pattern indicated by numeral 801 is thus obtained. This pattern 801 comprised of the silicon film will be used to form a gate electrode at a later step. In this way a structure shown in FIG. 8A is obtained.

Figure 8B:
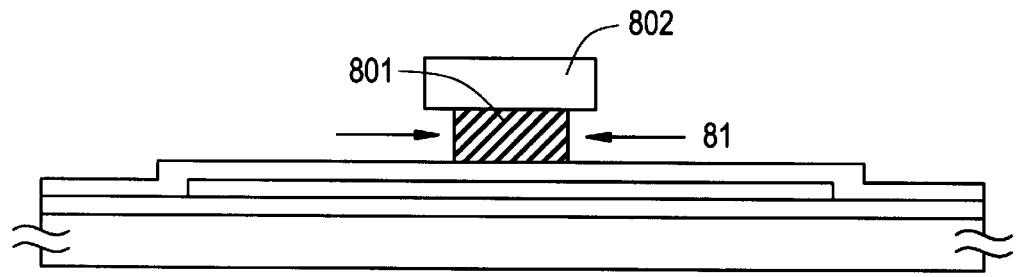

Then, the pattern 801 made of silicon film is etched using isotropic dry etching techniques or wet etching techniques. When this is done, the etching results in side etching 81 as shown in FIG. 8B due to the presence of the resist mask 802.

After completion of the side etching, phosphorus is then doped into selected regions of 803 and 805. This doping process is for formation of the source and drain regions and also for formation of a gettering cite.

This doping is called the "heavy doping" because of its increased dose amount as compared to that of doping to be done later. In this way two heavily-doped impurity regions 803, 805 are formed along with a non-doped region 804.

Figure 8C:
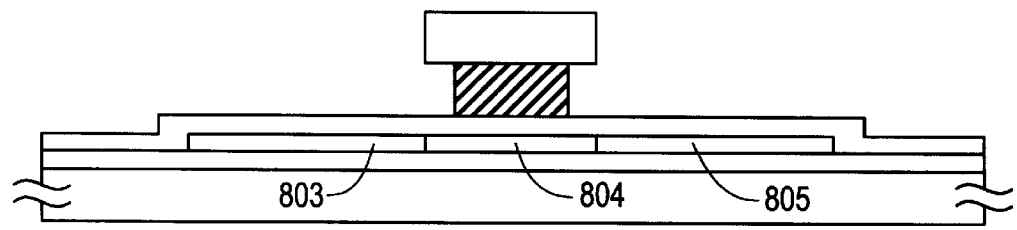

After completion of the doping shown in FIG. 8C, the resist mask 802 is removed away. In the state shown in FIG. 8D, doping of phosphorus is again performed. The doping here is carried out at a dose lower than that of the step of FIG. 8C. The doping at this step will be called the "light doping" for purposes of convenience.

At this step lightly-doped impurity regions 807 and 808 are formed. Then, thermal processing is performed at 600° C. for 2 hours in the nitride gas atmosphere. This thermal processing is to be performed at a carefully selected temperature which is as high as possible within a limited range lower than the distortion point of glass substrate 101 while eliminating outdiffusion of phosphorus doped.

At this step any residual nickel element in the active layer pattern 108 attempts to concentrate to the regions of 803 and 805. This state may also be seen as the one which is originated from the "gettering" effect of nickel elements of the regions of 807, 808 and 809 into the regions of 803 and 805.

Figure 8D:
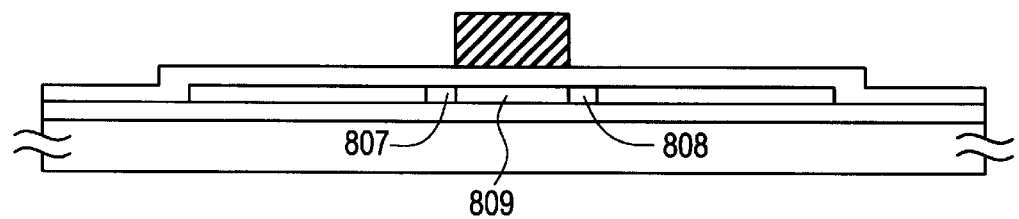

In this way the regions designated by 807, 808, 809 in FIG. 8D are forced to decrease in amount of residual nickel element.

Also, a channel formation region 809 is formed in a self-alignment manner.

The following process steps for fabrication of a TFT may be similar to those corresponding steps stated in conjunction with the first embodiment.

In the fabrication processes shown in this embodiment, the regions of 807 and 808 will be able to be formed as the offset regions by eliminating the light doping at the step shown in FIG. 8D.

As indicated in this embodiment, when the structure is employed which has the lightly-doped impurity regions or offset regions as formed by the scheme that does not employ the anodization techniques, the invention as disclosed in the specification will no longer be exclusively limited to those device structures that make use of aluminum or tantalum as the gate electrode material.

It must be noted here that in order to utilize the principles of the invention as disclosed in the specification, it is necessary to employ certain structures having lightly-doped impurity regions and/or offset regions disposed.

(Tenth Embodiment)

This embodiment is an example of the case of utilizing the invention disclosed in this specification to those TFTs of the "inverse stagger" type.

Some major steps in the manufacture of this embodiment are shown in FIGS. 9 and 10. First, a gate electrode 902 is formed on a glass substrate 901. Here, the gate electrode 902 is formed using a tungsten silicide.

Then, a silicon oxide film 903 is formed which functions as a gate insulation film. Further, an amorphous silicon film 904 is formed as a starting film for constituting an active layer. In this way a structure shown in FIG. 9A is obtained.

Figure 9A:
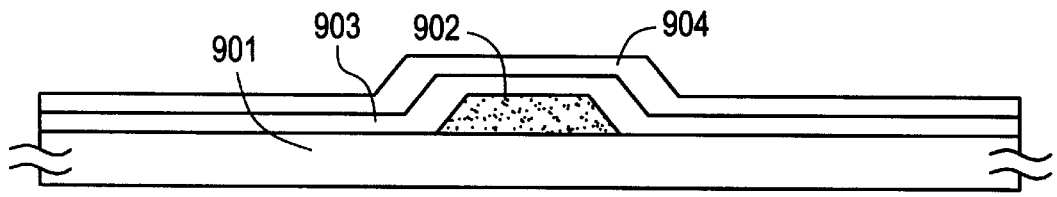
FIGS. 9A–9D are diagrams showing fabrication processes of a TFT.
Figure 9B:
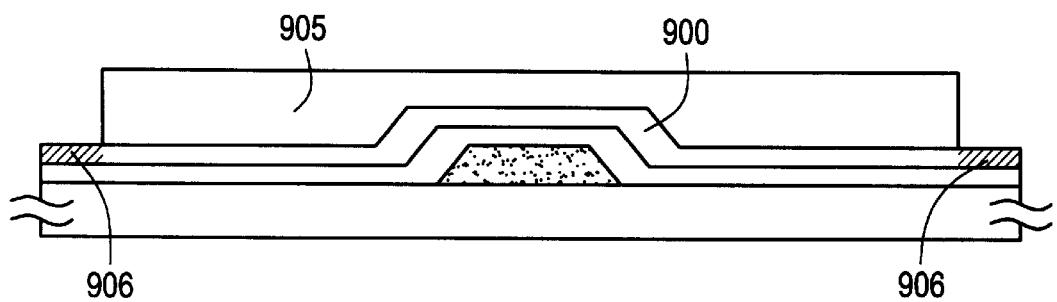

After obtaining the structure shown in FIG. 9A, crystallization using nickel is carried out to obtain a crystalline silicon film 900. (FIG. 9B)

Next, a resist mask 905 is disposed. And, doping of phosphorus is performed causing a region of 906 to be selectively doped with phosphorus. (FIG. 9B)

Next, the resist mask 905 is removed away. And, thermal processing is done at 600° C. for 2 hours in the nitride gas atmosphere. A heatup temperature at this time is substantially controlled depending on the thermal durability of the glass substrate.

Figure 9C:
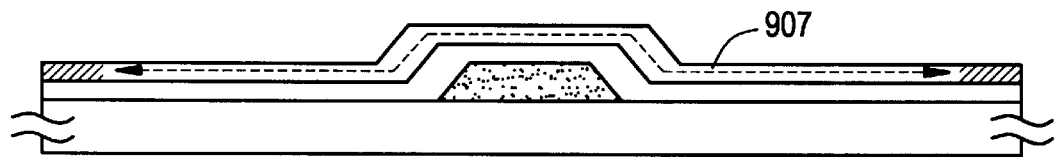

During this thermal processing any residual nickel element in the film behaves to move or migrate toward the region of 906 along a route as designated by numeral 907. In other words, the nickel element residing within the silicon film may be "gettered" to the region of 906. (FIG. 9C)

Figure 9D:
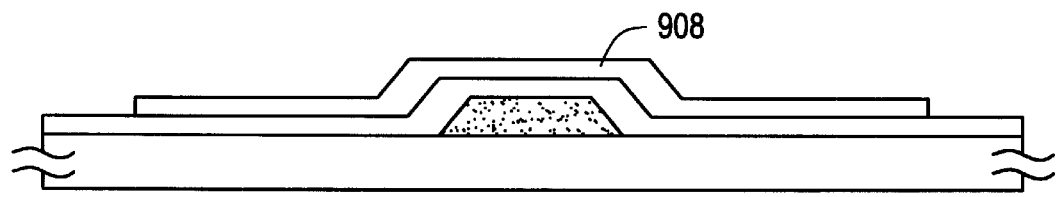

Next, the silicon film is patterned obtaining a pattern designated by numeral 908. This pattern constitutes the active layers of a TFT. (FIG. 9D)

It is important that this pattern 908 is designed to exclude the region of 906 as the gettering cite.

This is because the gettering cite can contain therein nickel element at an increased concentration.

This may be reworded in a way such that it is important that the nickel gettering cite as designated by numeral 906 is removed completely.

Figure 10A:
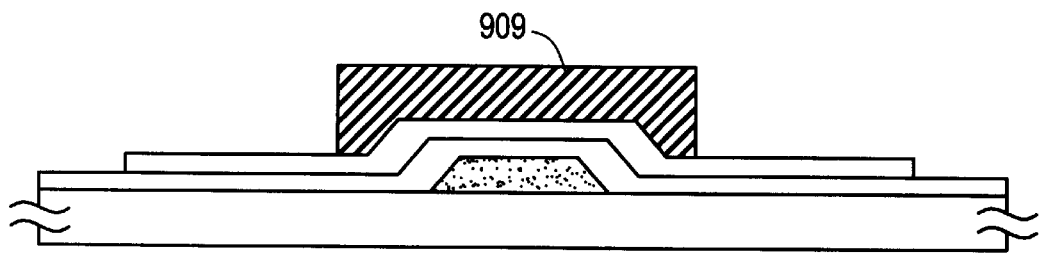
FIGS. 10A–10D is a diagram showing fabrication processes of a TFT.

Next, as shown in FIG. 10A, a resist mask 909 is disposed.

Figure 10B:
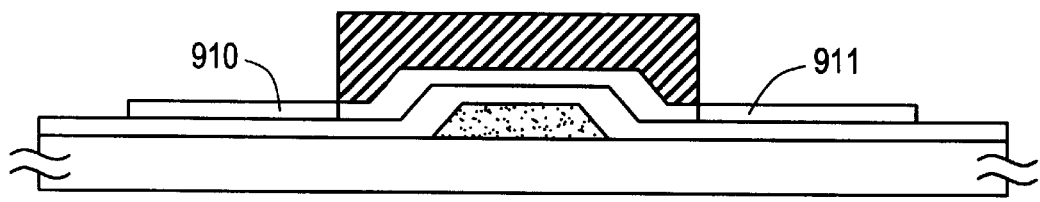

And, the resist mask 909 is used to perform doping of phosphorus into regions of 910 and 911. This doping is carried out under heavy doping conditions. (FIG. 10B)

Figure 10C:
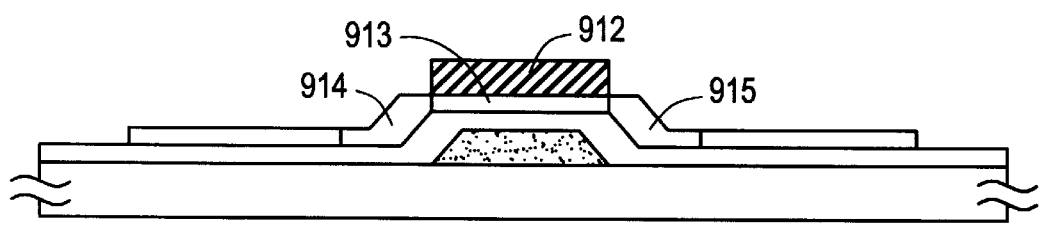

Next, isotropic ashing is performed for regression of the resist mask 909 to thereby form a resist mask pattern as designated by numeral 912 in FIG. 10C.

Under this condition, light doping of phosphorus is done. At this step the light doping of phosphorus is also performed with respect to regions of 914, 915.

Next, thermal processing is carried out at 600° C. for 2 hours in nitride gas atmosphere. This results in that the nickel element still residing within the active layers is "gettered" mainly to the regions of 910 and 911.

Next, the resist mask 912 is removed; then, laser light radiation and/or thermal processing may be done for activation of those regions doped.

In this way a source region 910 and drain region 911 as well as light-doped impurity regions 914 and 915 plus channel region 913 are formed.

Figure 10D:
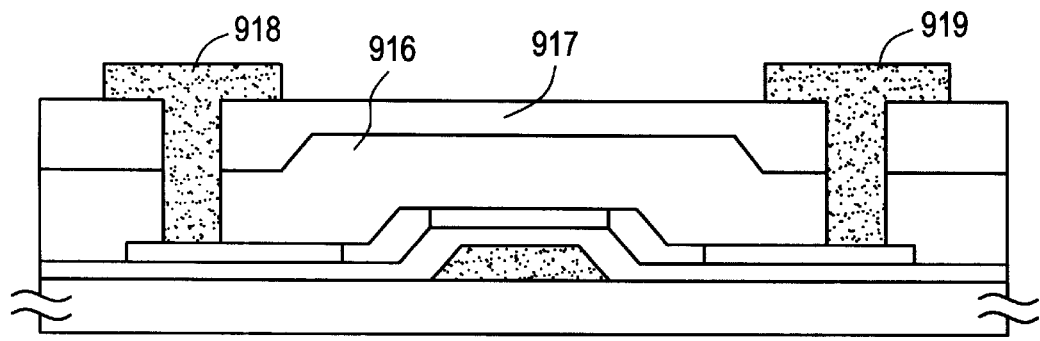
Figure 12A:
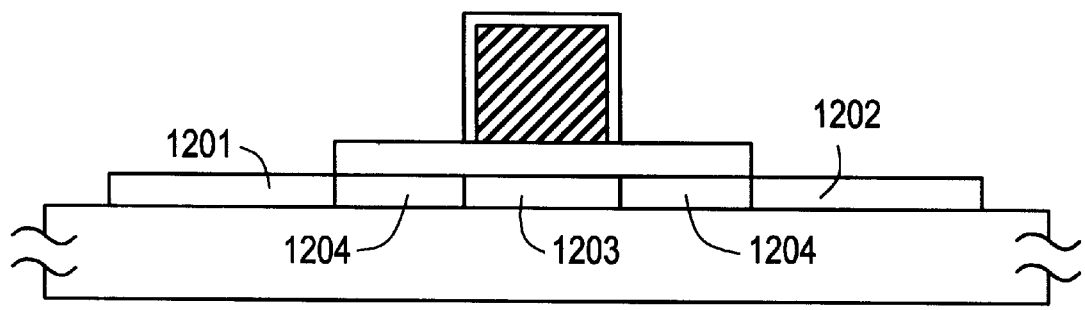
Figure 12B:
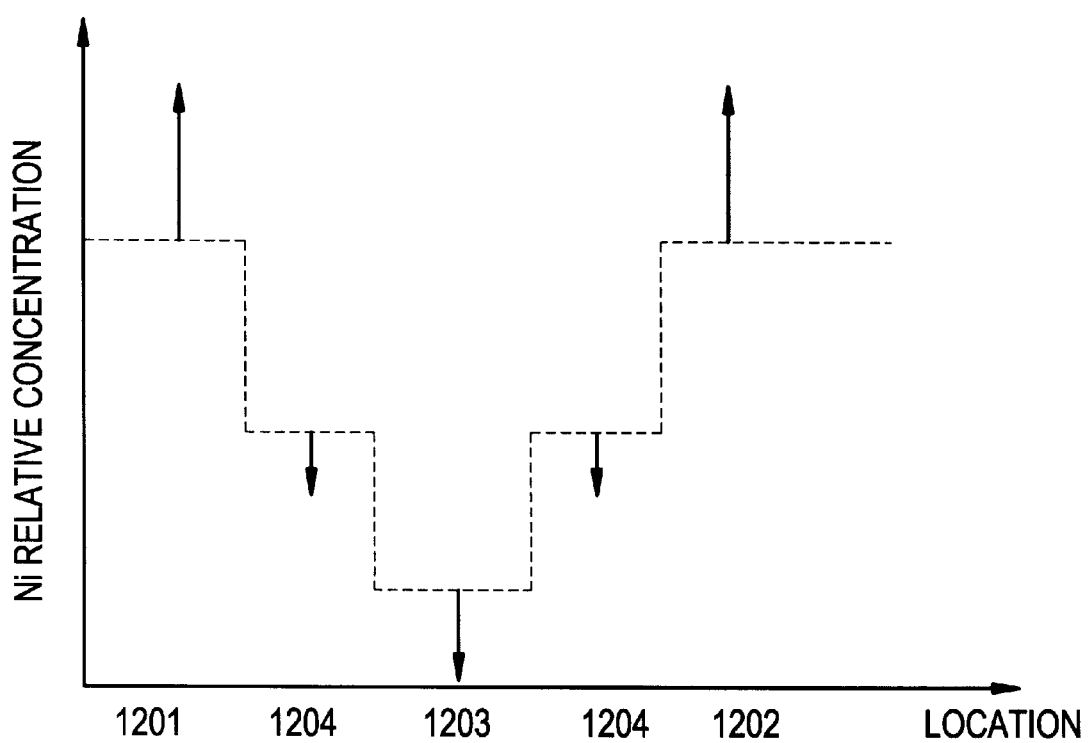
FIG. 12B is a diagram showing a distribution of Ni-concentration in active layers of the TFT.

Next, a silicon oxide film 916 is formed as an interlayer dielectric film; further, a resin film 917 is formed. (FIG. 10D)

Furthermore, contact holes are formed for fabrication of a source electrode 918 and drain electrode 919. A TFT of the bottom gate type is thus completed.

(Eleventh Embodiment)

This embodiment is designed to employ a method different from the crystallization method using nickel as has been described in other embodiments.

The crystal growth method shown in FIG. 1 is called the lateral growth technique, which is capable of extra-high electrical characteristics by letting the crystal growth axis be identical to the nickel gettering direction axis and further to the axis along the direction of carrier movement during operation.

However, this approach is faced with a problem: the complexity of nickel element introduction scheme (the same goes with the case of using other metal elements), which in turn leads to an increase in number of process steps required.

A method shown in this embodiment is designed to perform introduction of nickel element into the entire surface of an amorphous silicon film fabricated. (The same goes with the case where other metal elements are used.)

For example, at the processes shown in FIG. 1, the mask 104 made of silicon oxide film is not disposed allowing the entire surface of amorphous silicon film 103 to be exposed; under this condition, nickel acetate solution is applied or coated over the entire exposed surface.

This makes it possible to avoid the necessity of disposing a mask. Note however that since crystallization progresses over the entire surface, it is impossible to obtain the inherently intended characteristics which are as high as those of the lateral crystal growth.

In other words, the characteristics of the resulting TFT are less than those in the case of using lateral growth techniques. Instead, it becomes possible to obtain certain characteristics higher than those of prior art TFTs using crystalline silicon films as obtained without use of the metal element or elements.

(Twelfth Embodiment)

In this embodiment an example of semiconductor devices using the principles of the invention as disclosed in the specification is illustrated. In other words, those semiconductor devices using one or more TFTs using the invention disclosed in the specification are illustrated.

FIG. 11 shows several types of semiconductor devices. These semiconductor devices are designed to at least partly employ more than one TFT.

Shown in FIG. 11A is an information processing terminal of the hand-held type. This information processing terminal is equipped with a main body 2001 having thereon an active matrix type liquid crystal display (LCD) or active matrix type electro-luminescence (EL) display, and further a camera module 2002 for capturing or "importing" information from the outside.

The camera 2002 includes an image pickup/sensor section 2003 and manual operation switch 2004 disposed thereon.

Information processing terminals are expected to further decrease in thickness and weight for further improvement of the portability in future.

In the illustrative arrangement, it is preferable that a peripheral drive circuit and arithmetic circuit as well as storage circuit on a substrate with the active matrix type display 2005 mounted thereon are integrated together using TFTs.

See FIG. 11B, which illustrates a head mount display device. This device is provided in its main body 2101 with an active matrix LCD or EL display 2102. Also, the main body 2101 is designed enabling a band 2103 to be attached onto the head of a user or operator.

See FIG. 11C which depicts an LCD device of the projection type, which is the device as called the "front projection type."

This device has functions of causing an LCD device 2203 of the reflection type to optically modulate rays of light from a light source 2202 as provided within the main body 2201, and then enlarging or magnifying an image through an optical system 2204 to thereby project resultant images onto an associated screen 2205.

With such an arrangement, it is required that the optical system 2204 be minimized in dimension to reduce production costs. And also, the display device 2203 is demanded to be less in size accordingly.

When "down-sizing" of the flat panel display of the active matrix type, it should also be demanded that its associated peripheral drive circuit for driving the active matrix circuit be integrated on the same board or substrate together with the active matrix circuit.

This is because of the fact that where the active matrix circuit is reduced in size, it becomes difficult to mount thereto the peripheral drive circuit if such circuit is constituted from one or more separately mountable ICs.

Hence, the display device 2203 is so designed as to employ a specific arrangement which permits integration of the active matrix circuit and its peripheral drive circuit on the same substrate by use of TFTs.

Here, one specific example was indicated which makes use of the reflection type one as the LCD device 2203. Alternatively, an LCD device of the pass-through or permeation type may be employed. In this case the optical system used therein is rendered different.

See FIG. 11D, which shows a portable or handheld cordless radiotelephone handset unit. This device includes a main body 2301, which has an active matrix LCD device 2304, manual operation switches 2305, audio/voice input section 2303, audio/voice output section 2302, and antenna 2306.

In the recent years certain configurations become commercially available which employ a combination of the handheld information processing terminal shown in FIG. 11A and the portable radiotelephone handset shown in FIG. 11D.

Turning now to FIG. 11E, a handheld video camera is shown. This includes a main body 2401 which has an image pickup or sensing section 2406, audio input section 2403, manual operation switches 2404, active matrix LCD 2402, and battery 2405.

Referring to FIG. 11F an LCD device of the rear projection type is illustrated. This arrangement is a structure with a combination of a main body 2501 and a spaced-apart screen for image projection. A display is performed in a way such that rays of light coming from a light source 2502 are separated or split by a polarization beam splitter 2504 causing resultant separated light to be optically modulated by an LCD device 2503 of the refection type to thereby provide an optically modulated image, which is then reflected by reflectors 2505, 2506 thus letting the resulting light be projected onto the screen 2507.

Here, the reflection type device was shown as the LCD device 2503. However, an LCD device of pass-through or permeation type may alternatively be employable. In this case its optical system may be modified.

Use of the principles of the invention as disclosed in the specification makes it possible for those TFTs which are manufactured using a crystalline silicon film as crystallized using a specific metal element to suppress or prevent the affection of metal element from badly influencing the element characteristics of TFTs.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A thin-film transistor comprising:
    a lightly doped region adjacent to a channel region, and
    a source or drain region disposed neighboring to said lightly doped region,
    wherein said source or drain region contains therein a metal element for acceleration of crystallization of silicon at a concentration greater than or equal to $1 \times 10^{19}$ atoms per cubic centimeter (cm$^3$), and
    said metal element is contained in said channel region and said lightly doped region at a concentration less than or equal to $1 \times 10^{17}$ atoms per cm$^3$.

2. A transistor according to claim 1, wherein the source or drain region is doped with phosphorus.

3. A transistor according to claim 1, wherein the source or drain region is doped with phosphorus, and the phosphorus doped is higher in concentration than said metal element.

4. A transistor according to claim 1, wherein the source or drain region is of P type conductivity, and the source and drain regions are doped with phosphorus.

5. A transistor according to claim 1, wherein nickel (Ni) is used as the metal element.

6. A transistor according to claim 1, wherein the metal element is one or several elements as selected from the group consisting of Fe, Co, Ni, Ru, Rh, Pd, Os, Ir, Pt, Cu and Au.

7. The transistor of claim 1 wherein said lightly doped region is a lightly doped drain.

8. The transistor according to claim 1 wherein said transistor constitute an active matrix display device selected from the group consisting of a liquid crystal display and an electroluminescence display.

9. The transistor according to claim 8 wherein said active matrix display is incorporated into an electronic equipment selected from the group consisting of a portable computer, a head mount display, a portable phone, a video camera, a front-type projector and a rear-type projector.

10. A semiconductor device comprising:
    a channel region provided in a thin-film transistor;
    a lightly doped region provided in said thin-film transistor and adjacent to said channel region, and
    a source or drain region provided in said thin-film transistor and disposed neighboring to said lightly doped region,
    wherein said source or drain region contains therein a metal element for acceleration of crystallization of silicon at a concentration greater than or equal to $1 \times 10^{19}$ atoms per cubic centimeter (cm$^3$), and
    said metal element is contained in said channel region and said lightly doped region at a concentration less than or equal to $1 \times 10^{17}$ atoms per cm$^3$.

11. The device of claim 10 wherein said lightly doped region is a lightly doped drain.

12. The device according to claim 10 wherein said device is an active matrix display device selected from the group consisting of a liquid crystal display and an electroluminescence display.

13. The device according to claim 12 wherein said active matrix display is incorporated into an electronic equipment selected from the group consisting of a portable computer, a head mount display, a portable phone, a video camera, a front-type projector and a rear-type projector.

14. A thin-film transistor comprising:
    a lightly doped region disposed near a channel region, and
    a source or drain region disposed near said lightly doped region,
    wherein said source or drain region contains a metal element for acceleration of crystallization of silicon at a concentration greater than or equal to a density of defects in said region, and
    said metal element is contained in said channel region and said lightly doped region at a concentration less than or equal to the defect density therein.

15. The transistor of claim 14 wherein said lightly doped region is a lightly doped drain.

16. The transistor according to claim 14 wherein said transistor constitute an active matrix display device selected from the group consisting of a liquid crystal display and an electroluminescence display.

17. The transistor according to claim 16 wherein said active matrix display is incorporated into an electronic equipment selected from the group consisting of a portable computer, a head mount display, a portable phone, a video camera, a front-type projector and a rear-type projector.

18. A thin film transistor comprising:
    a lightly doped region adjacent to a channel region, and
    a source or drain region disposed neighboring to said lightly doped region,
    wherein said source or drain region contains therein a metal element for acceleration of crystallization of silicon at a concentration greater than or equal to $1 \times 10^{19}$ atoms per cubic centimeter (cm$^3$),
    wherein said lightly doped region contains said metal element at a concentration less than or equal to $1 \times 10^{17}$ atoms per cm$^3$.

19. The transistor of claim 18 wherein said lightly doped region is a lightly doped drain.

20. The transistor according to claim 18 wherein said transistor constitute an active matrix display device selected from the group consisting of a liquid crystal display and an electroluminescence display.

21. The transistor according to claim 20 wherein said active matrix display is incorporated into an electronic equipment selected from the group consisting of a portable computer, a head mount display, a portable phone, a video camera, a front-type projector and a rear-type projector.

22. A semiconductor device comprising:
    a channel region provided in a thin-film transistor;
    a lightly doped region provided in said thin-film transistor and adjacent to said channel region, and
    a source or drain region provided in said thin-film transistor and disposed neighboring to said lightly doped region, wherein said source or drain region contains therein a metal element for acceleration of crystallization of silicon at a concentration greater than or equal to $1\times10^{19}$ atoms per cubic centimeter (cm$^3$), and wherein an active region having a same conductivity as said channel region contains said metal element at a concentration less than or equal to $1\times10^{17}$ atoms per cm$^3$.

23. The device of claim 22 wherein said lightly doped region is a lightly doped drain.

24. The device according to claim 22 wherein said device is an active matrix display device selected from the group consisting of a liquid crystal display and an electroluminescence display.

25. The device according to claim 24 wherein said active matrix display is incorporated into an electronic equipment selected from the group consisting of a portable computer, a head mount display, a portable phone, a video camera, a front-type projector and a rear-type projector.

26. A thin-film transistor comprising:

a lightly doped region disposed near a channel region, and a source or drain region disposed near said lightly doped region, wherein said source or drain region contains a metal element for acceleration of crystallization of silicon at a concentration greater than or equal to $1\times10^{19}$ atoms per cubic centimeter (cm$^3$), and wherein said lightly doped region contains said metal element at a concentration less than or equal to $1\times10^{17}$ atoms per cm$^3$, said metal element is contained in proximity to an interface between said lightly doped region and said source or drain region.

27. The transistor of claim 26 wherein said lightly doped region is a lightly doped drain.

28. The transistor according to claim 26 wherein said transistor constitute an active matrix display device selected from the group consisting of a liquid crystal display and an electroluminescence display.

29. The transistor according to claim 28 wherein said active matrix display is incorporated into an electronic equipment selected from the group consisting of a portable computer, a head mount display, a portable phone, a video camera, a front-type projector and a rear-type projector.

30. A thin-film transistor comprising:

a channel region;

source or drain regions sandwiching said channel region; and a region having the same conductivity as said source and drain regions and provided between said channel region and corresponding one of said source and drain regions, wherein said source and drain regions contain therein a metal element for acceleration of crystallization of silicon at a concentration greater than or equal to $1\times10^{19}$ atoms per cubic centimeter (cm$^3$), and wherein said lightly doped region contains said metal element at a concentration less than or equal to $1\times10^{17}$ atoms per cm$^3$, said metal element is contained in at least one of said source and drain regions and in proximity to an interface between said region having the same conductivity as said source and drain regions and said one of said source and drain regions.

31. The transistor of claim 30 wherein said region having the same conductivity as said source and drain regions is a lightly doped drain.

32. The transistor according to claim 30 wherein said transistor constitute an active matrix display device selected from the group consisting of a liquid crystal display and an electroluminescence display.

33. The transistor according to claim 32 wherein said active matrix display is incorporated into an electronic equipment selected from the group consisting of a portable computer, a head mount display, a portable phone, a video camera, a front-type projector and a rear-type projector.

34. A semiconductor device comprising:

a channel region provided in a thin-film transistor;

source and drain regions provided in said thin-film transistor and sandwiching said channel region; and a region having the same conductivity as said source and drain regions and provided in said thin-film transistor between said channel region and corresponding one of said source and drain regions, wherein said source and drain regions contain therein a metal element for acceleration of crystallization of silicon at a concentration greater than or equal to $1\times10^{19}$ atoms per cubic centimeter (cm$^3$), and wherein an active region having a same property as said channel region contains said metal element at a concentration less than or equal to $1\times10^{17}$ atoms per cm$^3$.

35. The device of claim 34 wherein said region having the same conductivity as said source and drain regions is a lightly doped drain.

36. The device according to claim 34 wherein said device is an active matrix display device selected from the group consisting of a liquid crystal display and an electroluminescence display.

37. The device according to claim 36 wherein said active matrix display is incorporated into an electronic equipment selected from the group consisting of a portable computer, a head mount display, a portable phone, a video camera, a front-type projector and a rear-type projector.

38. A semiconductor device comprising:

a channel region provided in a thin film transistor, source and drain regions provided in a thin film transistor provided in a thin film transistor and sandwiching said channel region; and a region having the same conductivity as said source and drain regions and provided between said channel region and corresponding one of said source and drain regions, wherein said source and drain regions contain a metal element for acceleration of crystallization of silicon at a concentration greater than or equal to $1\times10^{19}$ atoms per cubic centimeter (cm$^3$), and wherein said metal element is contained in said region and an active region having same conductivity as said channel region at a concentration lower than in said source and drain region.

39. The device of claim 38 wherein said region having the same conductivity as said source and drain regions is a lightly doped drain.

40. The device according to claim 38 wherein said device is an active matrix display device selected from the group consisting of a liquid crystal display and an electroluminescence display.

41. The device according to claim 40 wherein said active matrix display is incorporated into an electronic equipment selected from the group consisting of a portable computer, a head mount display, a portable phone, a video camera, a front-type projector and a rear-type projector.

42. A thin-film transistor comprising:

a lightly doped region adjacent to a channel region, and a source or drain region disposed neighboring to said lightly doped region, wherein said source and drain region contains therein a metal element for acceleration of crystallization of silicon, and said metal element is contained in said channel region and said lightly doped region at a concentration lower than in said source or drain region.

43. The transistor of claim 42 wherein said lightly doped region is a lightly doped drain.

44. The transistor according to claim 42 wherein said transistor constitute an active matrix display device selected from the group consisting of a liquid crystal display and an electroluminescence display.

45. The transistor according to claim 44 wherein said active matrix display is incorporated into an electronic equipment selected from the group consisting of a portable computer, a head mount display, a portable phone, a video camera, a front-type projector and a rear-type projector.

46. A semiconductor device comprising:

a channel region provided in a thin-film transistor;

a lightly doped region provided in said thin-film transistor and adjacent to said channel region, and a source or drain region provided in said thin-film transistor and disposed neighboring to said lightly doped region, wherein said source or drain region contains therein a metal element for acceleration of crystallization of silicon, and said metal element is contained in said channel region and said lightly doped region at a concentration lower than in said source or drain region.

47. The device of claim 46 wherein said lightly doped region is a lightly doped drain.

48. The device according to claim 46 wherein said device is an active matrix display device selected from the group consisting of a liquid crystal display and an electroluminescence display.

49. The device according to claim 48 wherein said active matrix display is incorporated into an electronic equipment selected from the group consisting of a portable computer, a head mount display, a portable phone, a video camera, a front-type projector and a rear-type projector.

* * * * *